(12) United States Patent
Lee et al.

(10) Patent No.: US 9,680,109 B2
(45) Date of Patent: Jun. 13, 2017

(54) ORGANIC LIGHT EMITTING DIODE AND ORGANIC LIGHT EMITTING DISPLAY DEVICE INCLUDING THE SAME

(71) Applicant: SAMSUNG DISPLAY CO., LTD., Yongin, Gyeonggi-Do (KR)

(72) Inventors: Jung Sub Lee, Bucheon-si (KR); Seul Ong Kim, Suwon-si (KR); Youn Sun Kim, Seoul (KR); Dong Woo Shin, Seoul (KR); Naoyuki Ito, Seongnam-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 181 days.

(21) Appl. No.: 14/743,690

(22) Filed: Jun. 18, 2015

(65) Prior Publication Data

US 2016/0056386 A1 Feb. 25, 2016

(30) Foreign Application Priority Data

Aug. 19, 2014 (KR) ........................ 10-2014-0107647

(51) Int. Cl.
 *H01L 51/50* (2006.01)
 *H01L 51/00* (2006.01)
(52) U.S. Cl.
 CPC ........ *H01L 51/0059* (2013.01); *H01L 51/006* (2013.01); *H01L 51/0052* (2013.01);
 (Continued)
(58) Field of Classification Search
 None
 See application file for complete search history.

(56) References Cited

U.S. PATENT DOCUMENTS

| 2010/0295445 A1 | 11/2010 | Kuma et al. |
| 2012/0197179 A1 | 8/2012 | Khan et al. |

FOREIGN PATENT DOCUMENTS

| DE | 102006010915 | * 9/2007 | ............. C09K 11/06 |
| JP | 5208271 | 6/2013 | |

(Continued)

*Primary Examiner* — Gregory Clark
(74) *Attorney, Agent, or Firm* — Lee & Morse, P.C.

(57) ABSTRACT

An organic light emitting diode and an organic light emitting device, the organic light emitting diode including a first compound represented by the following Formula 1; and a second compound represented by the following Formula 2,

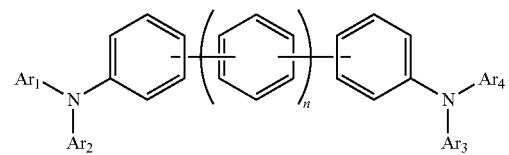

[Formula 1]

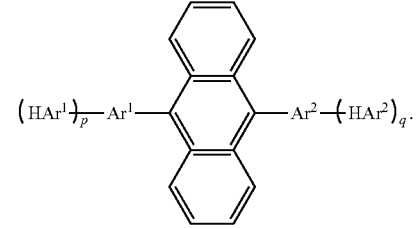

[Formula 2]

18 Claims, 4 Drawing Sheets

(52) U.S. Cl.
CPC ...... *H01L 51/0058* (2013.01); *H01L 51/0067* (2013.01); *H01L 51/0054* (2013.01); *H01L 51/0081* (2013.01); *H01L 51/5096* (2013.01); *H01L 2227/323* (2013.01)

(56) References Cited

FOREIGN PATENT DOCUMENTS

| | | |
|---|---|---|
| KR | 10-0624407 | 9/2006 |
| KR | 10-2013-0009614 A | 1/2013 |
| KR | 10-2014-0001757 A | 1/2014 |
| WO | WO 2012-070234 A1 | 5/2012 |

\* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATION

Korean Patent Application No. 10-2014-0107647 filed on Aug. 19, 2014, in the Korean Intellectual Property Office, and entitled: "Organic Light Emitting Diode and Organic Light Emitting Display Device Including the Same," is incorporated by reference herein in its entirety.

BACKGROUND

1. Field

Embodiments relate to an organic light emitting diode and an organic light emitting device including the same.

2. Description of the Related Art

Lightweight and thin personal computers and televisions sets may use lightweight and thin display devices. Flat panel displays satisfying such features are replacing conventional cathode ray tubes (CRT). An LCD is a passive display device, an additional backlight as a light source may be used, and the LCD may exhibit a slow response time and a narrow viewing angle.

An organic light emitting diode (OLED) display may have merits such as a wide viewing angle, outstanding contrast, and a fast response time. In the organic light emitting diode device, electrons injected from one electrode and holes injected from another electrode may be combined with each other in an emission layer, thereby generating excitons, and energy may be outputted from the excitons to thereby emit light.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode and an organic light emitting device including the same.

The embodiments may be realized by providing an organic light emitting diode including a first compound represented by the following Formula 1; and a second compound represented by the following Formula 2,

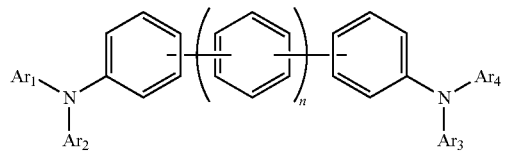

[Formula 1]

wherein, in Formula 1, $Ar_1$ to $Ar_4$ are each independently a substituted or unsubstituted aromatic hydrocarbon group, a substituted or unsubstituted aromatic heterocyclic group, or a substituted or unsubstituted condensed polycyclic aromatic group, and n is an integer of 2 to 4,

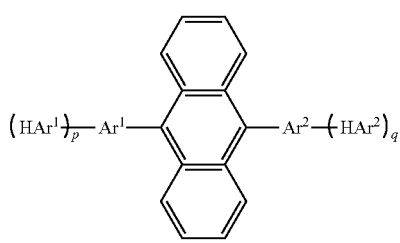

[Formula 2]

wherein, in Formula 2, $Ar^1$ is a substituted or unsubstituted phenylene group, $Ar^2$ is a substituted or unsubstituted phenylene group or a substituted or unsubstituted naphthylene group, $HAr^1$ and $HAr^2$ are each independently a substituted or unsubstituted pyridine group, a quinoline group, or an isoquinoline group, p and q are each independently integers of 0 to 3, and when p or q is 2 or greater, each $HAr^1$ is the same as or different from each other or each $HAr^2$ is the same as or different from each other.

The organic light emitting diode may include an anode, a cathode facing the anode, an emission layer between the anode and the cathode, a hole transport layer between the anode and the emission layer, an electron blocking layer between the emission layer and the hole transport layer, an electron transport layer between the cathode and the emission layer, and a hole blocking layer between the emission layer and the electron transport layer, the electron blocking layer includes the first compound, and the hole blocking layer includes the second compound.

The first compound represented by Formula 1 may be represented by one of Formula 1-1 to Formula 1-15:

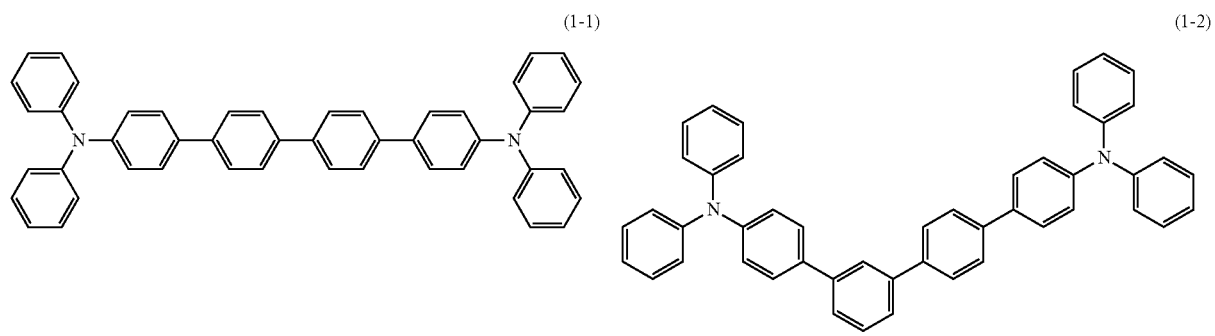

(1-1)

(1-2)

-continued
(1-3)
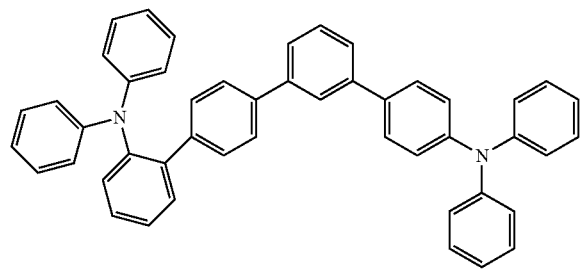
(1-4)
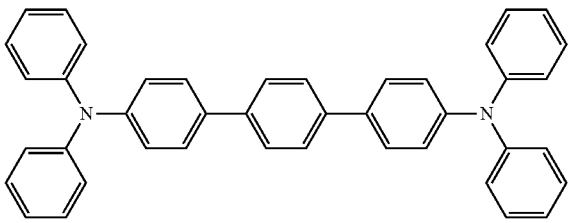
(1-5)
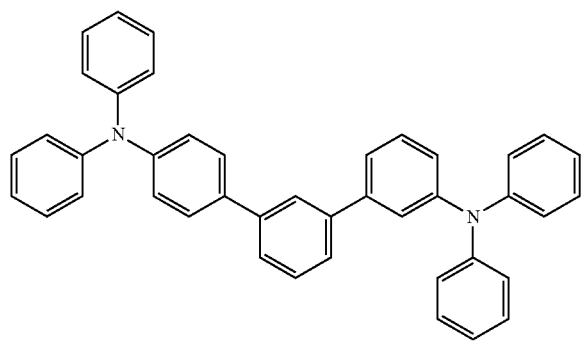
(1-6)
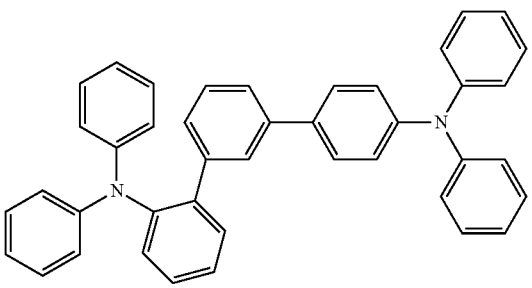
(1-7)
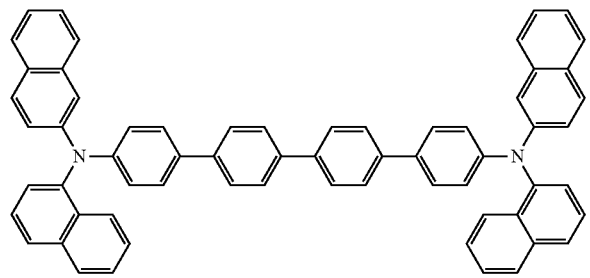
(1-8)
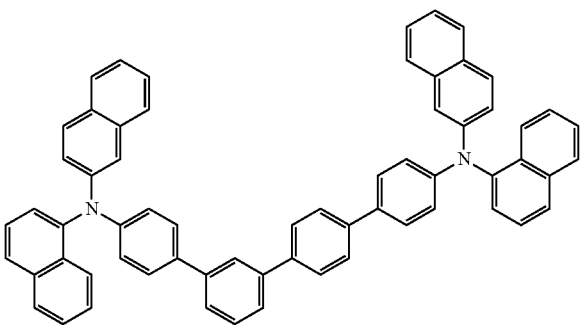
(1-9)
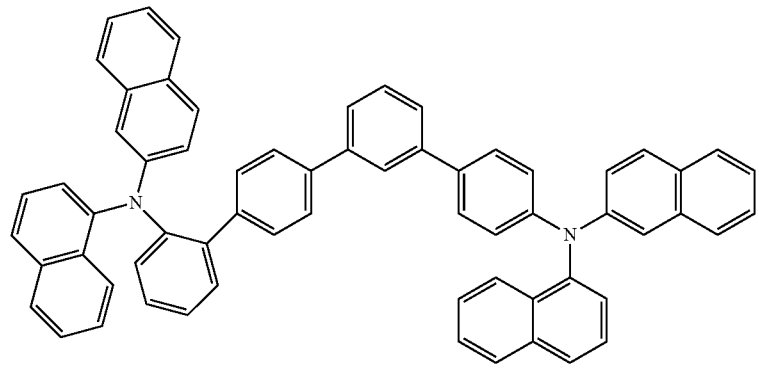

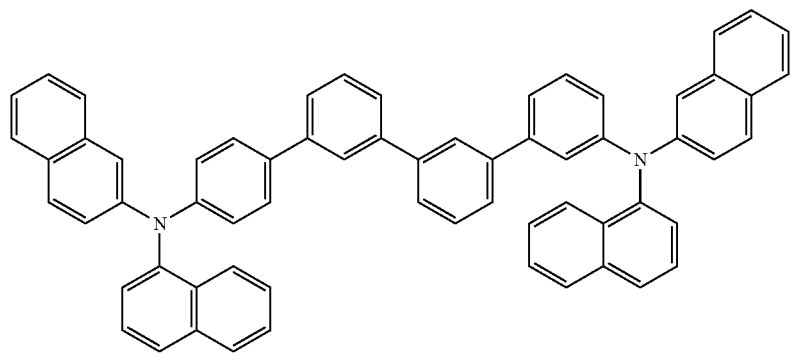
(1-10)
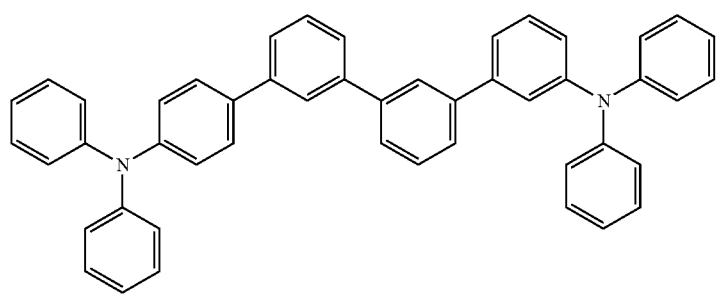
(1-11)
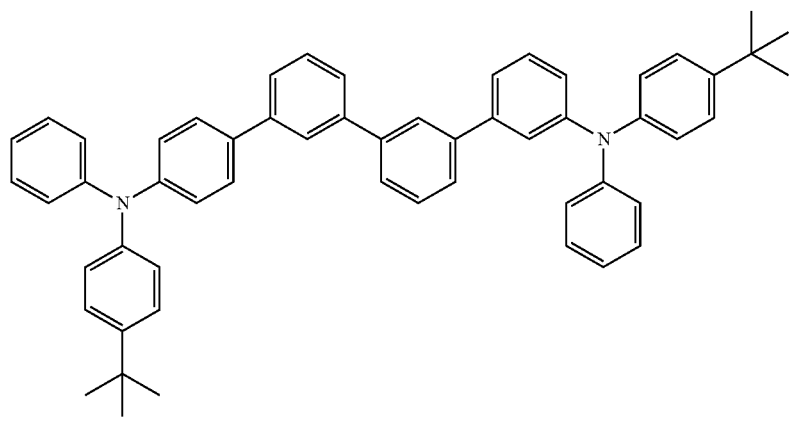
(1-12)
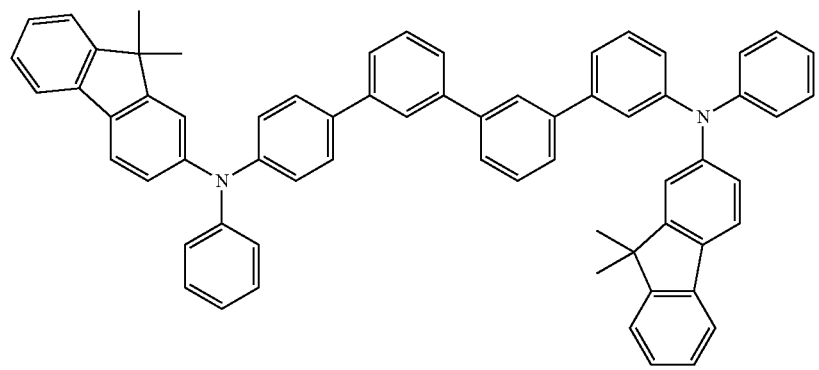
(1-13)

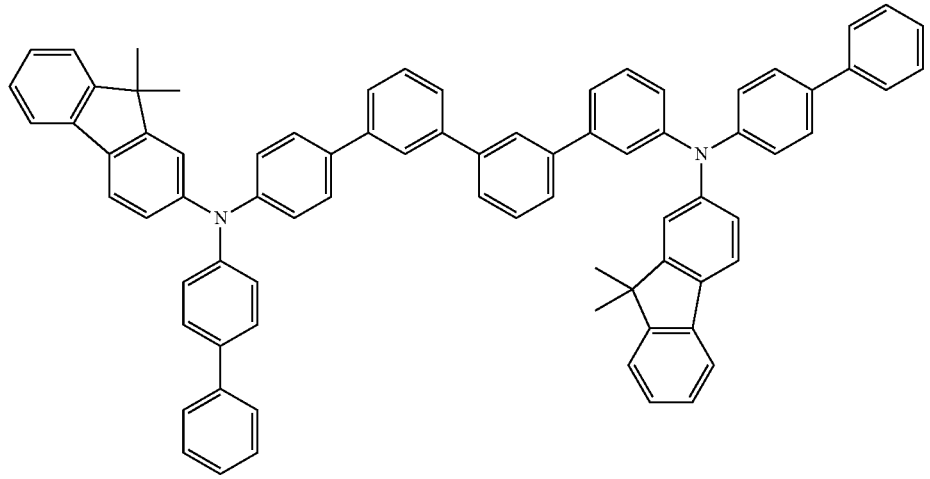
(1-14)
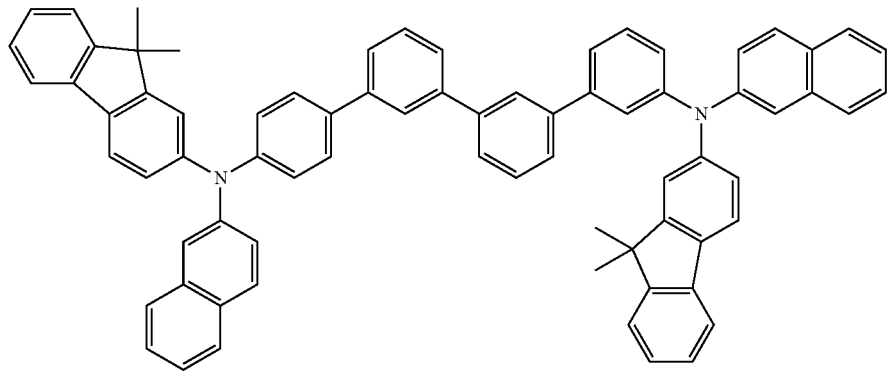
(1-15)
The second compound represented by Formula 2 may be represented by one of Formula 2-1 to Formula 2-9:
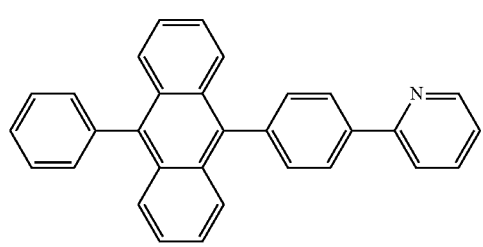
(2-1)
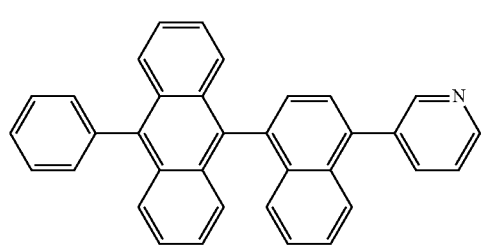
(2-2)
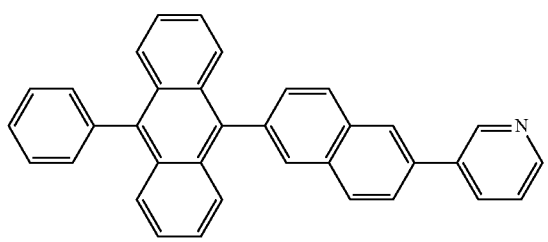
(2-3)
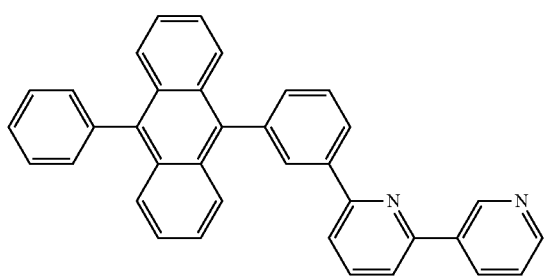
(2-4)

(2-5)

(2-6)

(2-7)

(2-8)

(2-9)

The emission layer may include at least one of tris(8-quinolinolate)aluminum (Alq3), 2-methyl-9,10-di(2-naphthyl) anthracene (MADN), 4,4'-N,N'-dicarbazol-biphenyl (CBP), or poly(n-vinylcarbazole) (PVK).

The emission layer may be doped with a third compound represented by the following Formula 3:

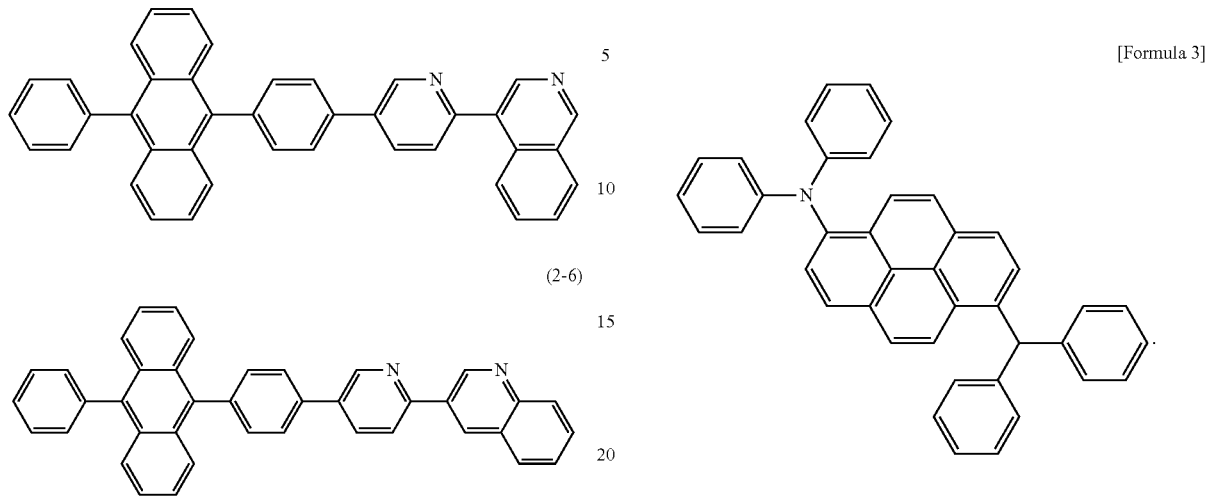

[Formula 3]

The third compound may be included in the emission layer in an amount of about 5 wt % or less, based on a total weight of the emission layer.

The hole transport layer may include at least one of 4,4'',4'''-tris[(3-methylphenyl(phenyl)amino)]triphenylamine (m-MTDATA), 1,3,5-tris[4-(3-methylphenylphenylamino)phenyl]benzene (m-MTDATB), copper phthalocyanine (CuPc), N-phenylcarbazole, polyvinylcarbazole, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or 4,4'-bis[N-(1-naphthyl)-N-phenylamino]biphenyl (NPB).

The electron transport layer may include at least one of Alq3, TAZ, Balq, or Bebq2.

The embodiments may be realized by providing an organic light emitting device including a substrate; a gate line on the substrate; a data line and a driving voltage line crossing the gate line; a switching thin film transistor connected to the gate line and the data line; a driving thin film transistor connected to the switching thin film transistor and the driving voltage line; and an organic light emitting diode connected to the driving thin film transistor, wherein the organic light emitting diode includes a first compound represented by the following Formula 1, and a second compound represented by the following Formula 2:

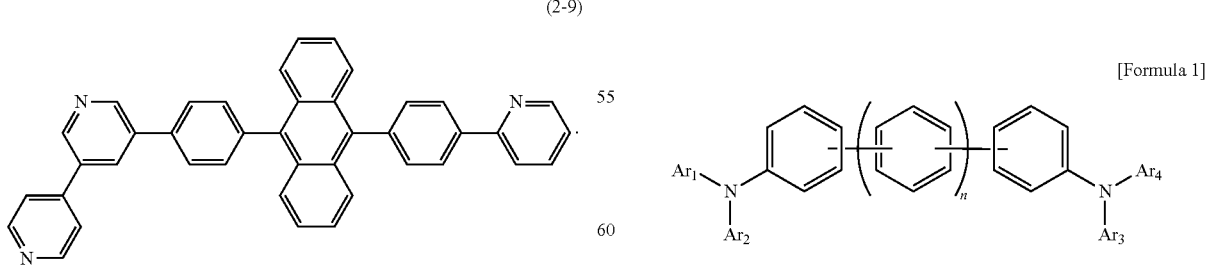

[Formula 1]

wherein, in Formula 1, $Ar_1$ to $Ar_4$ are each independently a substituted or unsubstituted aromatic hydrocarbon group, a substituted or unsubstituted aromatic heterocyclic group, or a substituted or unsubstituted condensed polycyclic aromatic group, and n is an integer of 2 to 4,

[Formula 2]

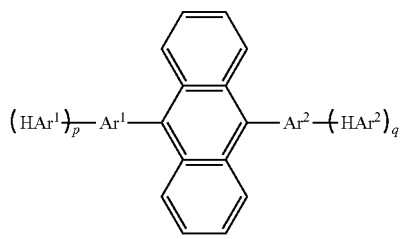

wherein, in Formula 2, $Ar^1$ is a substituted or unsubstituted phenylene group, $Ar^2$ is a substituted or unsubstituted phenylene group or a substituted or unsubstituted naphthylene group, $HAr^1$ and $HAr^2$ are each independently a substituted or unsubstituted pyridine group, a quinoline group, or an isoquinoline group, p and q are each independently integers of 0 to 3, and when p or q is 2 or greater, each $HAr^1$ is the same as or different from each other or each $HAr^2$ is the same as or different from each other.

The organic light emitting diode may include an anode, a cathode facing the anode, an emission layer between the anode and the cathode, a hole transport layer between the anode and the emission layer, an electron blocking layer between the emission layer and the hole transport layer, an electron transport layer between the cathode and the emission layer, and a hole blocking layer between the emission layer and the electron transport layer, the electron blocking layer includes the first compound, and the hole blocking layer includes the second compound.

The first compound represented by Formula 1 may be represented by one of Formula 1-1 to Formula 1-15:

(1-1)

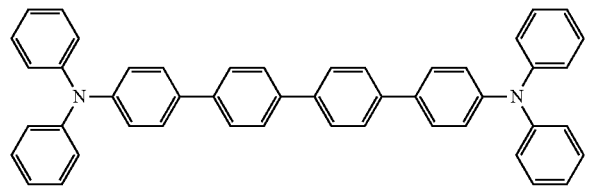

(1-2)

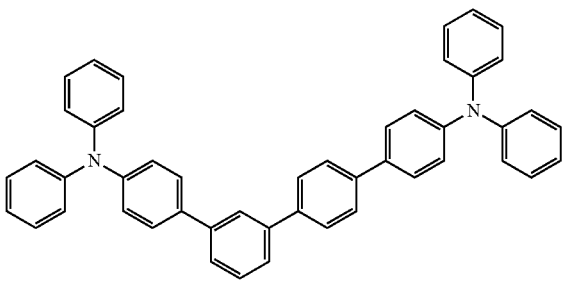

(1-3)

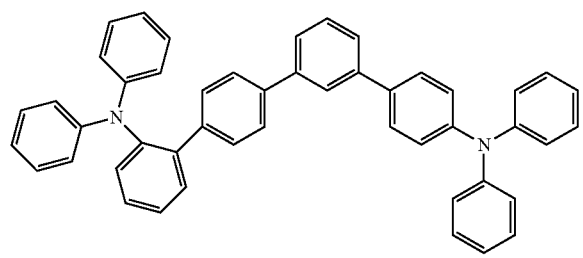

(1-4)

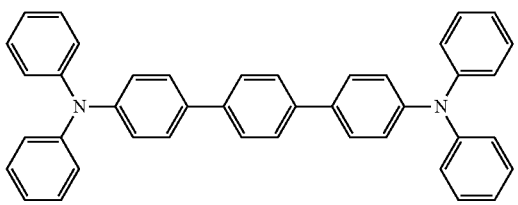

(1-5)

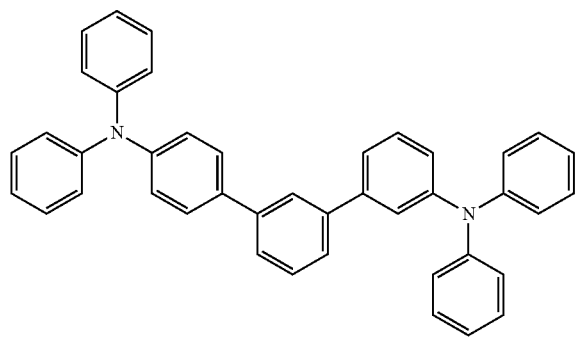

(1-6)

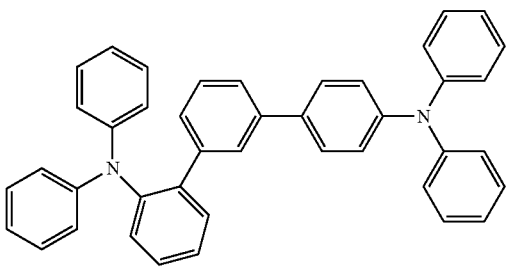

(1-7)
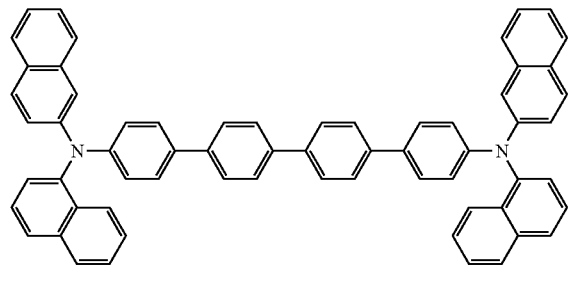
(1-8)
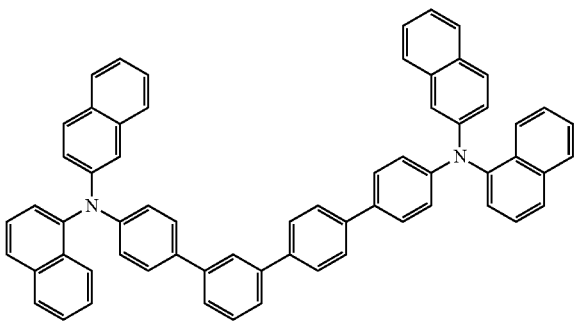
(1-9)
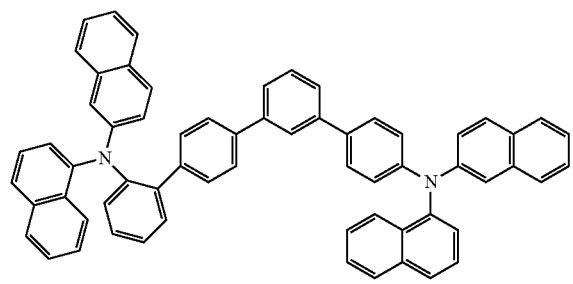
(1-10)
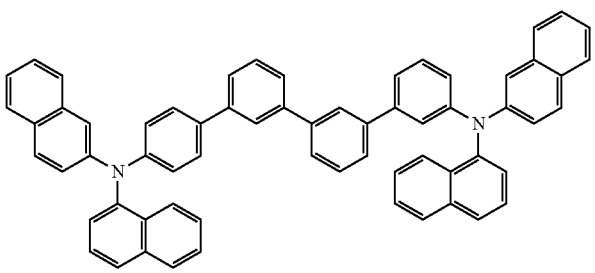
(1-11)
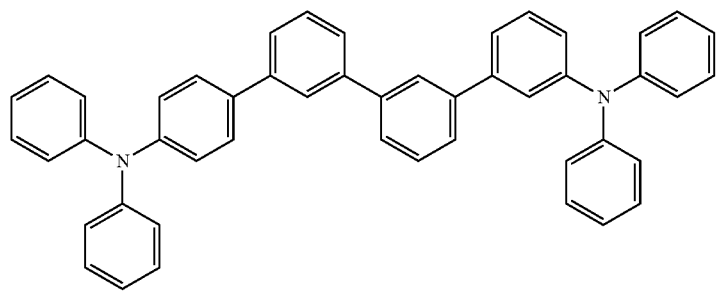
(1-12)
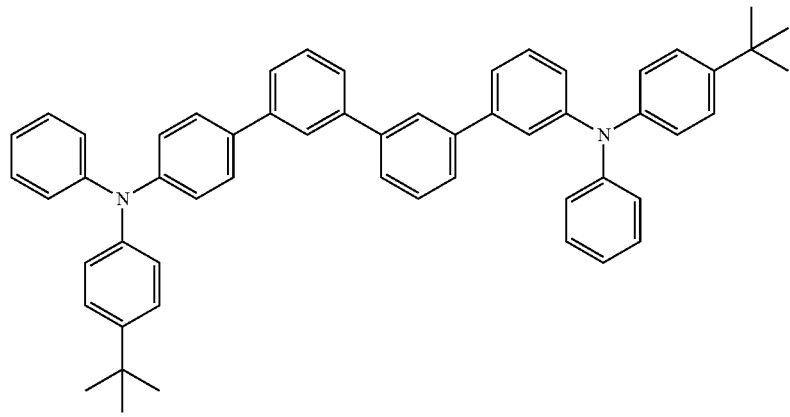

-continued
(1-13)
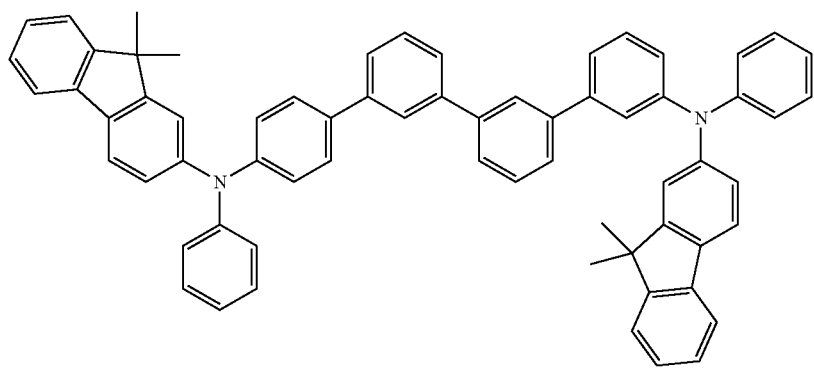
(1-14)
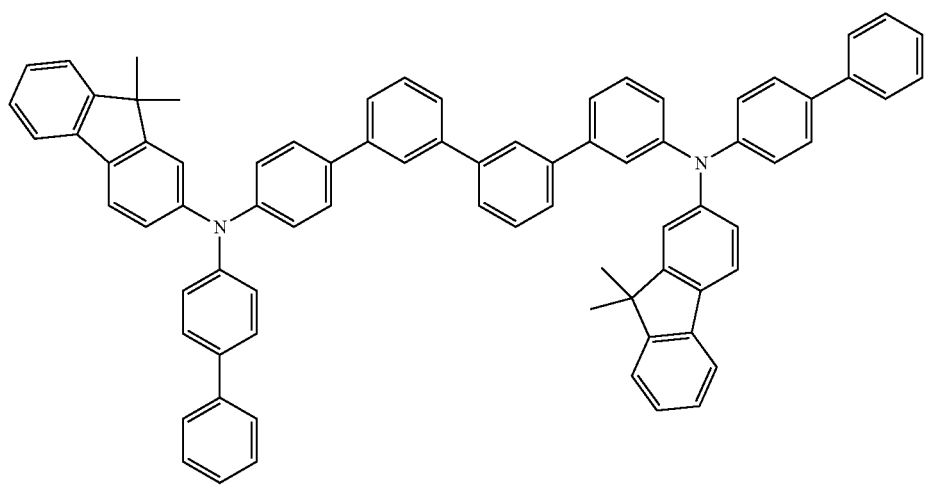
(1-15)
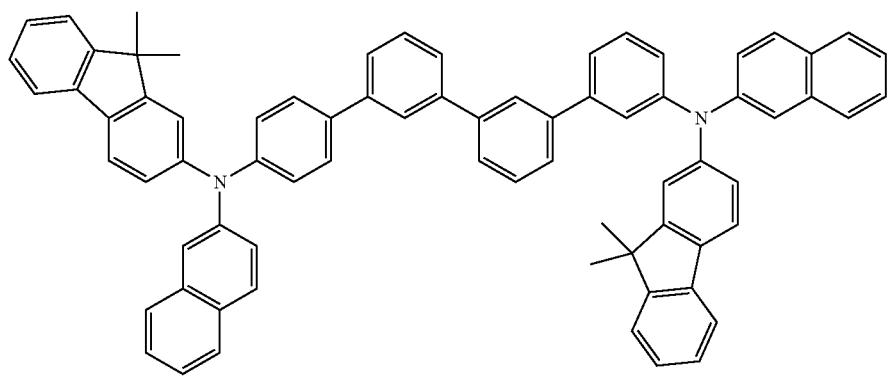
The second compound represented by Formula 2 may be represented by one of Formula 2-1 to Formula 2-9:
-continued
(2-1)
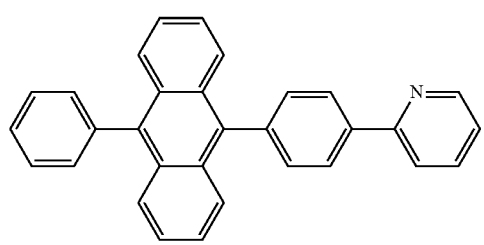
(2-2)
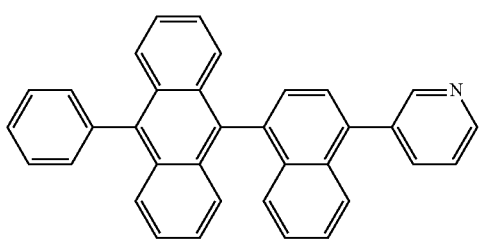

-continued (2-3)
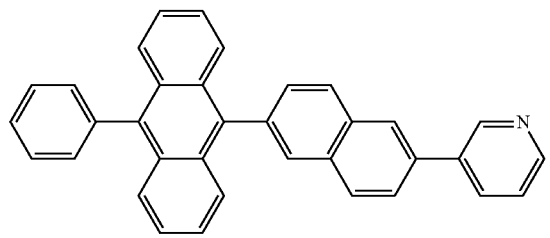

(2-4)
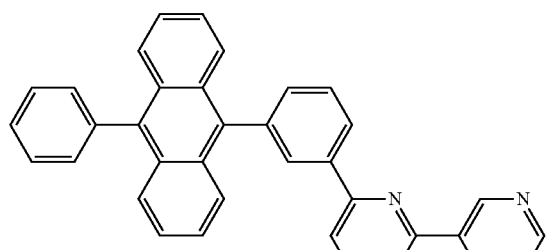

(2-5)
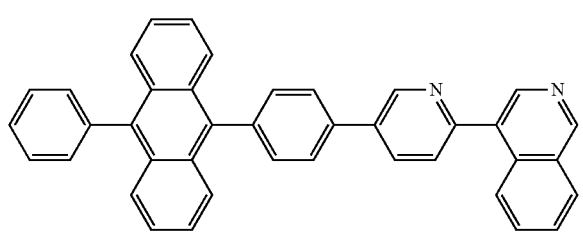

(2-6)
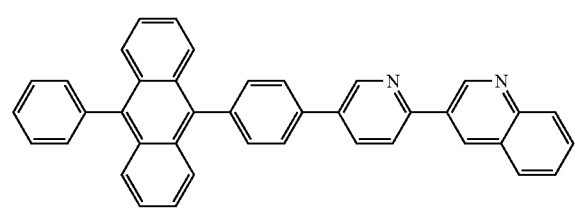

(2-7)
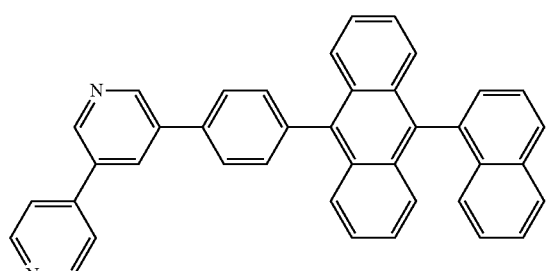

(2-8)
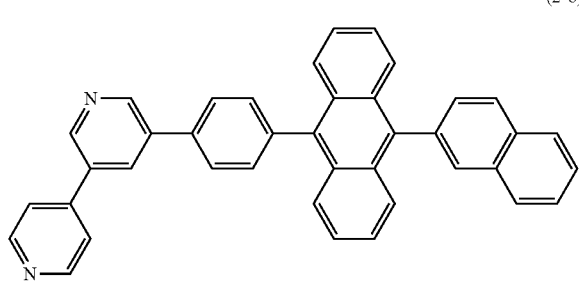

-continued (2-9)
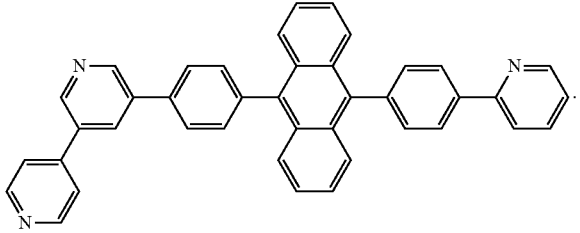

The emission layer may include at least one of tris(8-quinolinolate)aluminum (Alq3), 2-methyl-9,10-di(2-naphthyl)anthracene (MADN), 4,4'-N,N'-dicarbazol-biphenyl (CBP), or poly(n-vinylcarbazole) (PVK).

The emission layer may be doped with a third compound represented by the following Formula 3:

[Formula 3]

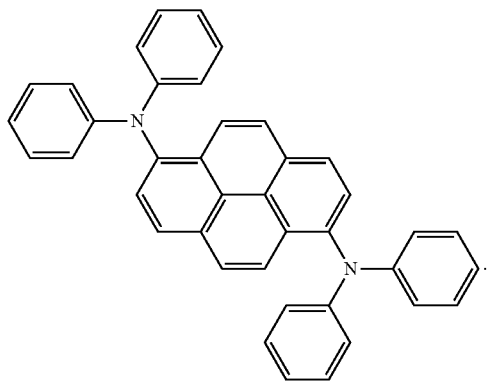

The third compound may be included in the emission layer in an amount of about 5 wt % or less, based on a total weight of the emission layer.

The hole transport layer may include at least one of 4,4'',4''''-tris[(3-methylphenyl(phenyl)amino)]triphenylamine (m-MTDATA), 1,3,5-tris[4-(3-methylphenylphenylamino)phenyl]benzene (m-MTDATB), copper phthalocyanine (CuPc), N-phenylcarbazole, polyvinylcarbazole, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or 4,4'-bis[N-(1-naphthyl)-N-phenylamino]biphenyl (NPB).

The electron transport layer may include at least one of Alq3, TAZ, Balq, or Bebq2.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
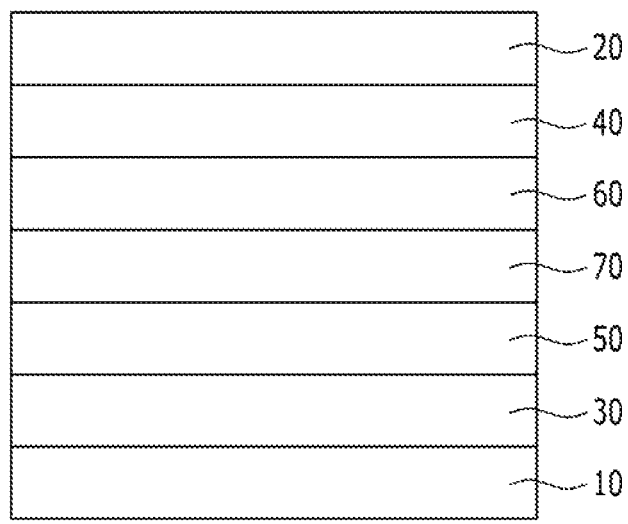
FIG. 1 illustrates a configuration of an organic light emitting diode according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the present specification, the term "substituted", unless separately defined otherwise, means a substitution of at least one hydrogen atom with a substituent selected from a group consisting of deuterium, C1 to C30 alkyl groups, C6 to C36 aryl groups, C2 to C30 heteroaryl groups, C1 to C30 alkoxy groups, C2 to C30 alkenyl groups, C6 to C30 aryloxy groups, C3 to C30 silyloxy groups, C1 to C30 acyl groups, C2 to C30 acyloxy groups, C2 to C30 heteroacyloxy groups, C1 to C30 sulfonyl groups, C1 to C30 alkylthio groups, C6 to C30 arylthio groups, C1 to C30 heterocyclothiol groups, C1 to C30 phosphoric acid amide groups, C3 to C40 silyl groups, NR"R'" (here, R" and R'" are respectively substituents selected from a group consisting of a hydrogen atom, C1 to C30 alkyl groups, and C6 to C30 aryl groups), a carboxylic acid group, a halogen group, a cyano group, a nitro group, an azo group, a fluorene group, and a hydroxyl group.

As used herein, the term "hetero," unless separately defined otherwise, means that a single ring contains one to three heteroatoms selected from the group consisting of B, N, O, S, P, Si, and P(=0), and carbon atoms as the remainder.

Further, among groups used in chemical formulae of the present specification, definition of a representative group is as follows. (The number of carbons that limits substituents is not restrictive, and does not limit characteristics of the constituents).

An unsubstituted C1 to C20 alkyl group may be a linear type or a branched type, and nonrestrictive examples of the unsubstituted C1 to C30 alkyl may be methyl, ethyl, propyl, iso-propyl, sec-butyl, hexyl, iso-amyl, hexyl, heptyl, octyl, nonanyl, dodecyl, and the like.

An unsubstituted C1 to C20 alkoxy group indicates a group having a structure of —OA (wherein A is an unsubstituted C1 to C20 alkyl group as described above). Non-limiting examples of the unsubstituted C1 to C30 include a methoxy group, an ethoxy group, a propoxy group, an isopropyloxy group, a butoxy group, and a pentoxy group.

An unsubstituted C6 to C30 aryl group indicates a carbocyclic aromatic system containing at least one ring. At least two rings may be fused to each other or linked to each other by a single bond. The term aryl refers to an aromatic system, such as phenyl, naphthyl, or anthracenyl. Examples of the unsubstituted C6 to C30 aryl group may be selected from a group consisting of a phenyl group, a tolyl group, a biphenyl group, a naphthyl group, an anthracenyl group, a terphenyl group, a fluorenyl group, a phenanthrenyl group, a pyrenyl group, a diphenylanthracenyl group, a dinaphthylanthracenyl group, a pentacenyl group, a bromophenyl group, a hydroxyphenyl group, a stilbene group, an azobenzenyl group, and a ferrocenyl group.

An unsubstituted C2 to C30 heteroaryl group includes one, two, or three heteroatoms selected from a group consisting of B, N, O, S, P, Si, and P(=0), and at least two rings may be fused to each other or linked to each other by a single bond. An example of the unsubstituted C2 to C30 heteroaryl group includes a pyrazolyl group, an imidazolyl group, an oxazolyl group, a triazolyl group, a triazinyl group, a triazolyl group, a tetrazolyl group, an oxadiazole group, a thiadiazole group, a pyridinyl group, a pyridazinyl group, a pyrimidinyl group, a triazinyl group, a carbazole group, an N-phenylcarbazole group, an indolyl group, a quinolyl group, an isoquinolyl group, a thiophene group, a dibenzothiophene group, a dibenzofuran group, and a benzimidazolyl group.

Figure 2:
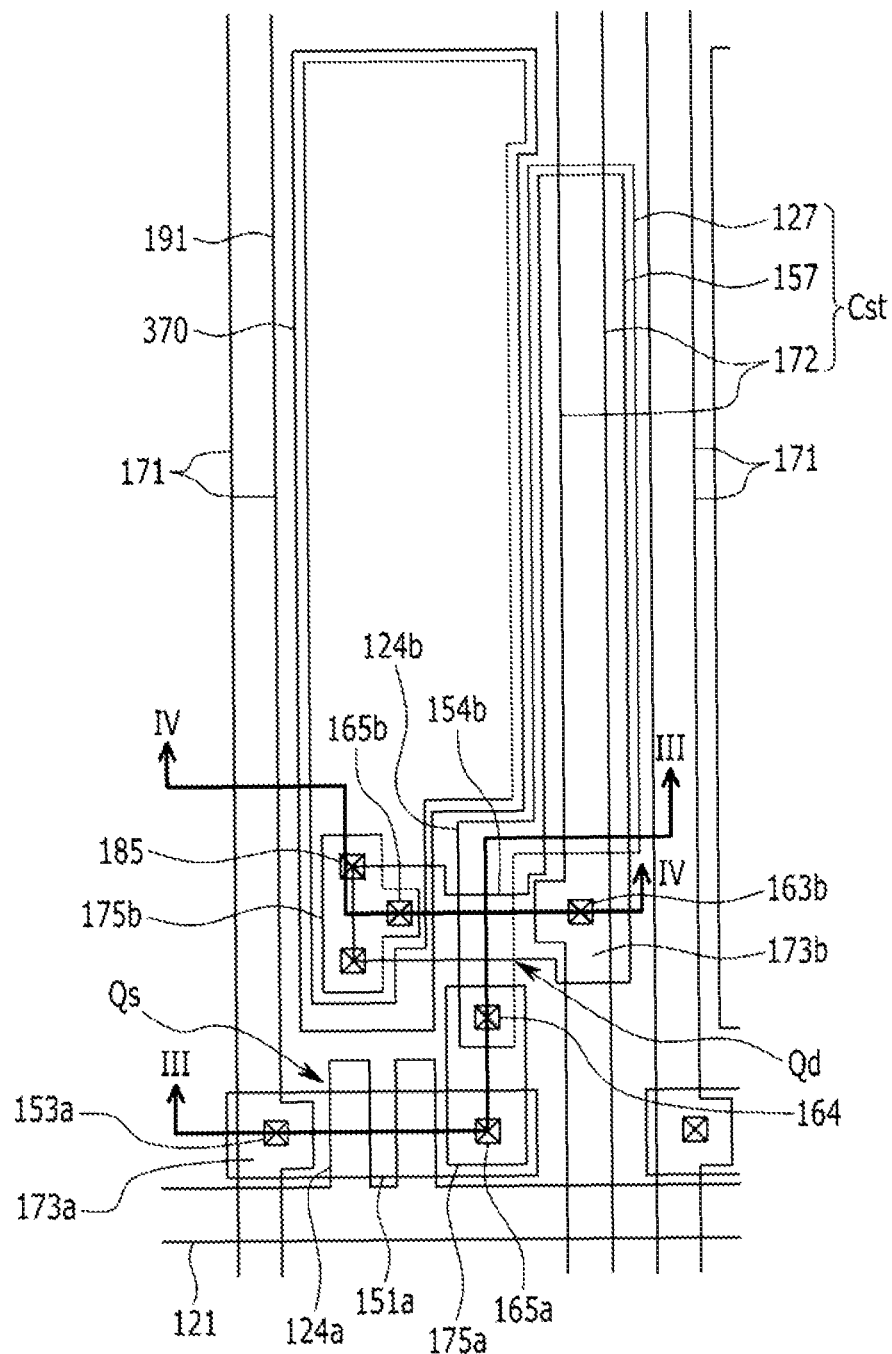
FIG. 2 illustrates a layout view of an organic light emitting device according to an exemplary embodiment.

An organic light emitting diode according to an exemplary embodiment will now be described in detail. FIG. 1 and FIG. 2 illustrate views of an organic light emitting diode according to an exemplary embodiment.

Referring to FIG. 1, the organic light emitting diode may include, e.g., an anode 10, a cathode 20 facing the anode 10, an emission layer 70 between the anode 10 and the cathode 20, a hole transport layer 30 between the anode 10 and the emission layer 70, an electron transport layer 40 between the cathode 20 and the emission layer 70, an electron blocking layer 50 between the hole transport layer 30 and the emission layer 70, and a hole blocking layer 60 between the electron transport layer 40 and the emission layer 70.

A substrate (not shown) may be disposed on a side of the anode 10 or the cathode 20. The substrate may be made of, e.g., an inorganic material such as glass, an organic material such as polycarbonate, (PC), polymethylmethacrylate (PMMA), polyethylene terephthalate (PET), polyamide (PA), polyethersulfone (PES), or a combination thereof, a silicon wafer, or the like.

The anode 10 may be a transparent or non-transparent electrode. The transparent electrode may be made of a conductive oxide, e.g., indium tin oxide (ITO), indium zinc oxide (IZO), tin oxide ($SnO_2$), zinc oxide (ZnO), or a combination thereof, or a metal such as aluminum, silver, or magnesium, having a thin thickness. The non-transparent electrode may be made of, e.g., a metal, e.g., aluminum, silver, or magnesium.

In an implementation, regarding the anode 10 of the organic light emitting diode device according to an exemplary embodiment, a reflective layer may be formed with silver (Ag), aluminum (Al), chromium (Cr), molybdenum (Mo), tungsten (W), titanium (Ti), gold (Au), palladium (Pd), or an alloy thereof, and transparent electrode materials such as ITO, IZO, or ZnO may be stacked as the reflective layer.

The anode 10 may be formed by using, e.g., a sputtering method, a vapor phase deposition method, an ion beam deposition method, an electron beam deposition method, or a laser abrasion method.

The cathode 20 may contain a substance with a small work function to facilitate electron injection. An example of the substance may include a metal such as magnesium, calcium, sodium, potassium, titanium, indium, yttrium, lithium, gadolinium, aluminum, silver, tin, lead, cesium, barium, or an alloy thereof, or a multilayer structure substance such as LiF/Al, $LiO_2$/Al, LiF/Ca, LiF/Al, or $BaF_2$/Ca. In an implementation, the electrode of a metal such as aluminum or the like may be employed as the cathode.

In an implementation, magnesium, calcium, tin, lead, titanium, yttrium, lithium, ruthenium, manganese, aluminum, lithium fluoride, and their alloys may be usable for a conductive material used in the cathode 20 according to an exemplary embodiment, e.g., magnesium/silver, magnesium/indium, or lithium/aluminum may be used for the alloy. An alloy ratio of the alloys may be controlled according to a temperature of a deposition source, an atmosphere, and a vacuum degree, and may be selected to have a suitable ratio value.

In an implementation, the anode 10 and the cathode 20 may be configured to have a plurality of layers.

The emission layer 70 may include a blue, red, or green emission material, and the emission layer 70 may include a host and a dopant. The host of the emission layer may include, e.g., at least one material selected from a group including tris(8-quinolinolate)aluminum (Alq3), 2-methyl-9,10-di(2-naphthyl) anthracene (MADN), 4,4'-N,N'-dicarbazol-biphenyl (CBP), or poly(n-vinylcarbazole) (PVK).

The emission layer 50 may be doped with a third compound represented by Formula 3.

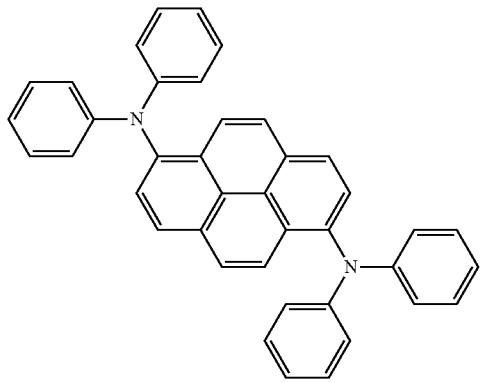

[Formula 3]

A weight ratio of the host of the emission layer to the third compound may be, e.g., 95:5.

The emission layer 70 may additionally include another dopant material. In the case of the dopant material, IDE102 or IDE105 that may be purchased from Idemitsu Company and C545T that may be bought from Hayashibara Company may be usable for a fluorescent dopant, and a PtOEP red phosphorescent dopant, RD 61 made by UDC Company, an Ir(PPy)$_3$ (PPy=2-phenylpyridine) green phosphorescent dopant, an F$_2$Irpic blue phosphorescent dopant, and an RD 61 red phosphorescent dopant made by UDC Company may be usable for a phosphorescent dopant.

In an implementation, Ir(ppy)$_3$, Ir(ppy)$_2$acac, (piq)$_2$Ir(acac), and Pt(OEP) may be used for the dopant of the emission layer 70.

In an implementation, a content of the dopant may be about 0.01 to 15 parts by weight, based on 100 parts by weight of the host. In an implementation, the dopant may be included in the emission layer in an amount of about 5 wt % or less, based on a total weight of the emission layer.

The emission layer may be 100 Å to 1,000 Å thick, e.g. 200 Å to 600 Å. Maintaining the thickness of the emission layer at about 100 Å or greater may help prevent deterioration in an emission characteristic. Maintaining the thickness of the emission layer at about 1,000 Å or less may help prevent an increase in driving voltage and may help prevent deterioration in efficiency and service life.

The emission layer 70 may be formed by using various methods, e.g., a vacuum deposition method, a spin coating method, a cast method, or an LB method.

When an organic layer such as the emission layer 70 is formed by using the vacuum deposition method, deposition conditions depend on a compound used as a material of the organic layer, and a configuration and a thermal characteristic of the target organic layer, and in general, a deposition temperature can be selected between 100 and 500° C., the vacuum degree can be selected between $10^{-8}$ and $10^{-3}$ torr, and the deposition speed can be selected between 0.01 and 100 Å/sec.

When an organic layer such as the emission layer 70 is formed by using the spin coating method, coating conditions depend on a compound used as a material of the organic layer and a configuration and a thermal characteristic of the target organic layer, and a coating speed can be selected between 2,000 to 5,000 rpm and a heat treatment temperature for removing a solvent after a coating process can be selected within an 80 to 200° C. temperature range.

The hole transport layer 30 may include a suitable hole transport material, e.g., an arylene diamine derivative, a starburst compound, a biphenyl diamine derivative including a spiro group, or a ladder-type compound. In an implementation, the hole transport material may include, e.g., 4,4",4""-tris[(3-methylphenyl(phenyl)amino)]triphenylamine (m-MTDATA), 1,3,5-tris[4-(3-methylphenylphenylamino)phenyl]benzene (m-MTDATB), and copper phthalocyanine (CuPc), a carbazole derivative such as N-phenylcarbazole or polyvinylcarbazole, or an amine derivative including an aromatic condensed ring such as N,N'-bis(3-methylphenyl)-N,N'-diphenyl-[1,1-biphenyl]-4,4'-diamine (TPD) or N,N'-di(naphthalene-1-yl)-N,N'-diphenyl benzidine (α-NPD).

The hole transport layer 30 may be about 50 to 2,000 Å thick, e.g., 500 to 1500 Å thick. When the thickness of the hole transport layer 30 satisfies the above-noted range, an excellent hole transport characteristic may be obtainable without a substantial increase of the driving voltage.

The hole transport layer 30 may further include an auxiliary material to help improve conductivity of the layer. When the hole transport layer 30 includes the auxiliary material, the auxiliary material may be modifiable with numerous variations, e.g., it may be uniformly or non-uniformly spread to the layers.

The hole transport layer may be formed by using various methods such as a vacuum deposition method, a spin coating method, a cast method, or an LB method. When the hole transport layer is formed by the vacuum deposition method and the spin coating method, the deposition conditions and the coating conditions may be different according to the compound used.

In an implementation, a hole injection layer (not shown) that is a material for facilitating injection of holes from the anode may be stacked between the hole transport layer 30 and the anode.

The material of the hole injection layer may be a suitable hole injection material including, e.g., TCTA, m-MTDATA, m-MTDAPB, polyaniline/dodecylbenzenesulfonic acid (Pani/DBSA) which is a soluble conductive polymer, or poly(3,4-ethylenedioxythiophene)/poly(4-styrenesulfonate) (PEDOT/PSS), polyaniline/camphor sulfonic acid (Pani/CSA), or polyaniline/poly(4-styrenesulfonate) (PANI/PSS).

The hole injection layer may be formed by using various methods such as the vacuum deposition method, the spin coating method, the cast method, or the LB method. When the hole injection layer is formed according to the vacuum deposition method, the deposition conditions may depend on a compound used for a material of the hole injection layer, and a configuration and a thermal characteristic of the target hole injection layer, and in general, it may be desirable to appropriately select a deposition temperature between 100 and 500° C., a vacuum degree between $10^{-8}$ and $10^{-3}$ torr, a deposition speed between 0.01 and 100 Å/sec, and a layer thickness between 10 Å and 5 μm.

When the hole injection layer is formed by using the spin coating method, coating conditions may depend on a compound used as a material of the hole injection layer, and a configuration and a thermal characteristic of the target hole injection layer, and it may be desirable to appropriately select a coating speed substantially between 2,000 and 5,000 rpm and a heat treatment temperature for removing a solvent after a coating process substantially between 80 and 200° C.

The deposition conditions and the coating conditions of the hole injection layer may be similarly applicable to formation of the hole transport layer.

The electron transport layer 40 may include a quinoline derivative, e.g., at least one compound selected from a group including tris(8-quinolinolate)aluminum (Alq3), TAZ, Balq, and Bebq2.

The electron transport layer may be about 100 to 1,000 Å thick, e.g. 200 to 500 Å. Maintaining the thickness of electron transport layer at about 100 Å of greater may help prevent deterioration of electron transport characteristics. Maintaining the thickness of the electron transport layer at about 1,000 Å or less may help prevent an increase in the driving voltage.

The electron transport layer 40 may be formed by using various methods such as the vacuum deposition method, the spin coating method, or the cast method. When the electron transport layer 40 is formed by using the vacuum deposition method and the spin coating method, the conditions may be changeable according to the compound.

An electron injection layer (not shown) that is a material for facilitating injection of electrons from the cathode may be stacked between the electron transport layer and the cathode. The material may include, e.g., LiF, NaCl, CsF, $Li_2O$, or BaO. The deposition conditions of the electron injection layer may follow the compound used, and may generally be selected from among almost the same condition range as formation of the hole injection layer.

In an implementation, the electron blocking layer 50 may include a first compound represented by the following Formula 1.

[Formula 1]

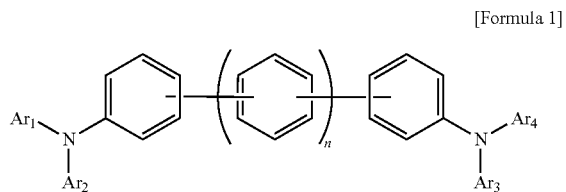

In Formula 1, $Ar_1$ to $Ar_4$ may each independently be, e.g., a substituted or unsubstituted aromatic hydrocarbon group (e.g., an aryl group), a substituted or unsubstituted aromatic heterocyclic group (e.g., a heteroaryl group), or a substituted or unsubstituted condensed polycyclic aromatic group. n may be an integer of 2 to 4, e.g., may be 2, 3, or 4.

The first compound represented by Formula 1 may be represented by one of Formula 1-1 to Formula 1-15.

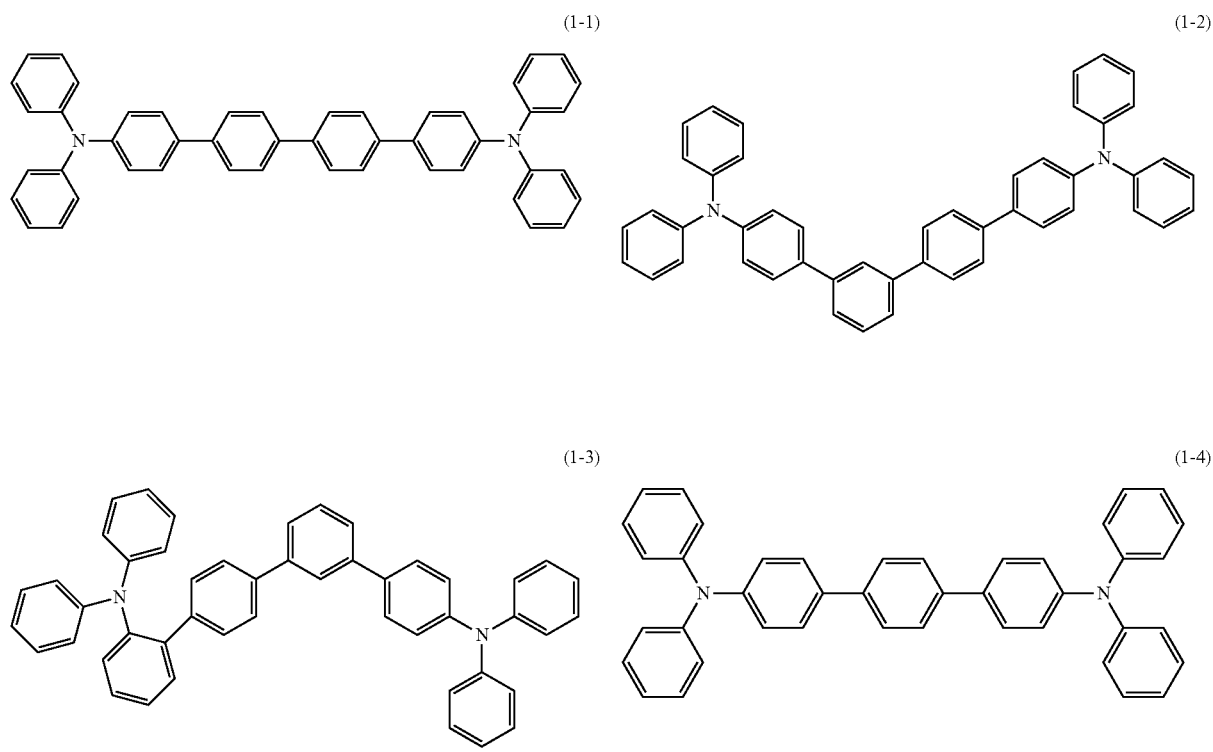

-continued
(1-5)
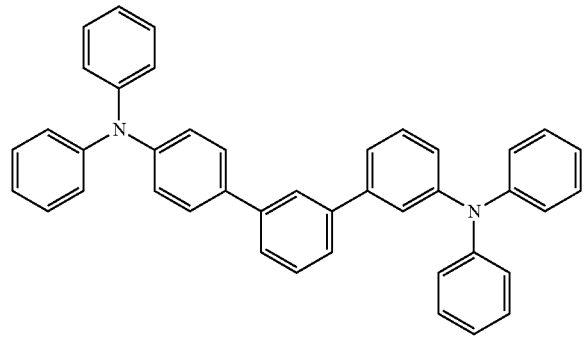
(1-6)
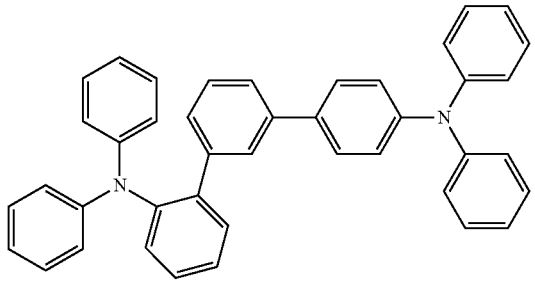
(1-7)
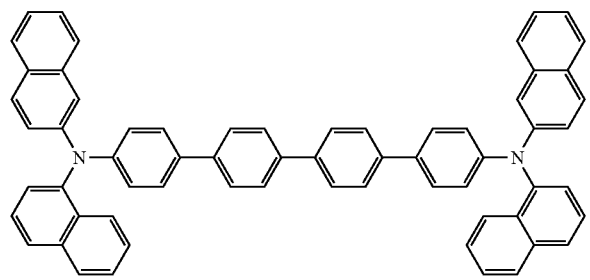
(1-8)
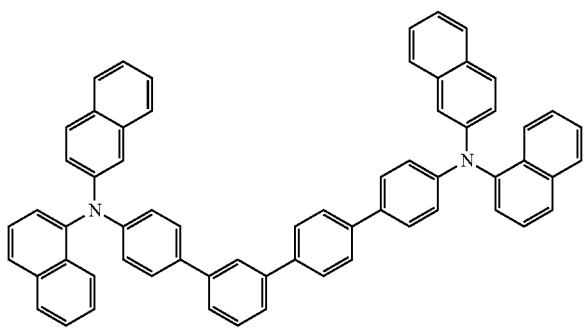
(1-9)
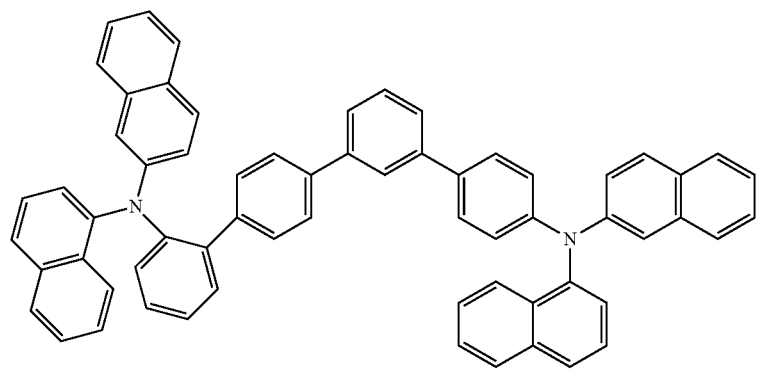
(1-10)
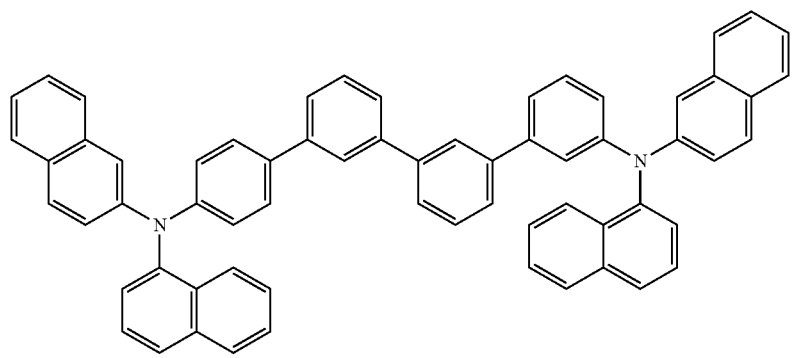

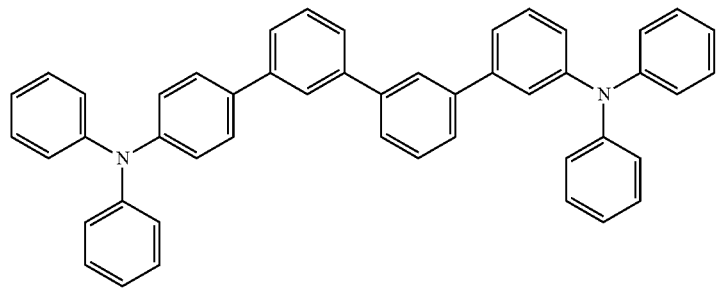
(1-11)
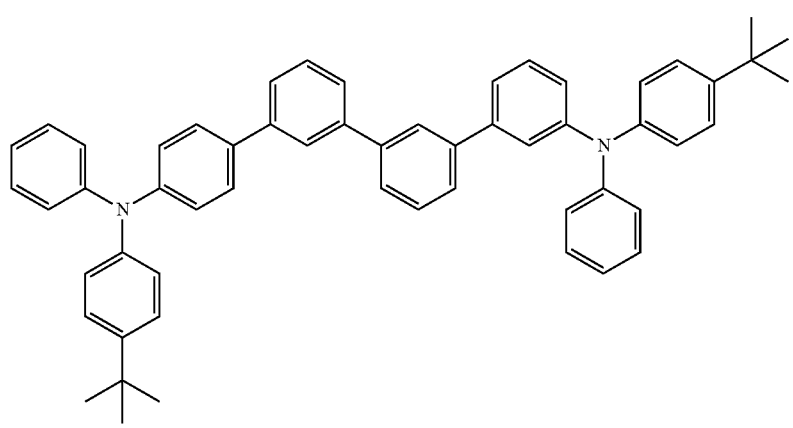
(1-12)
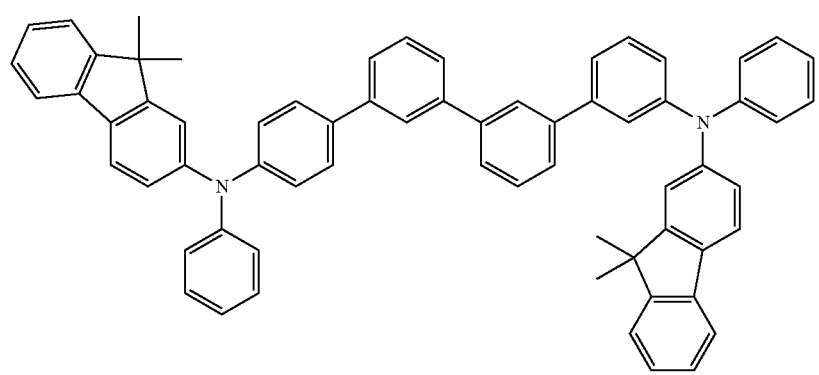
(1-13)
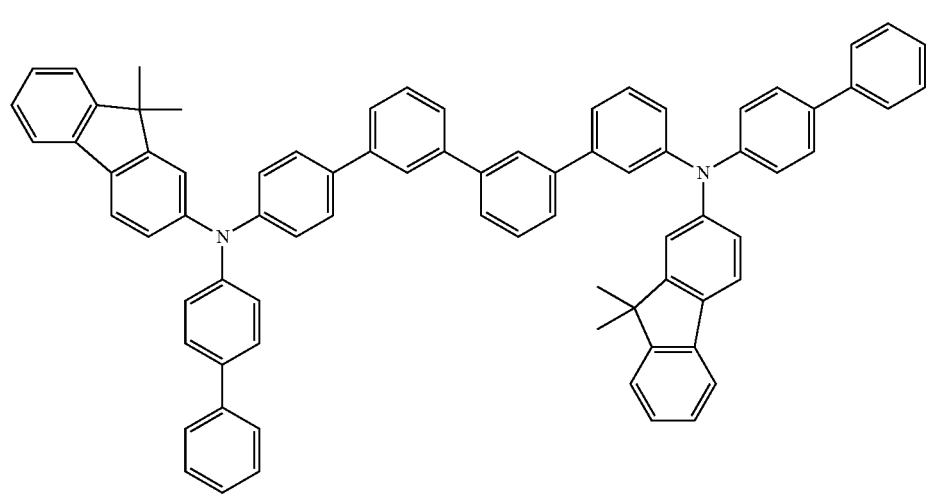
(1-14)

(1-15)

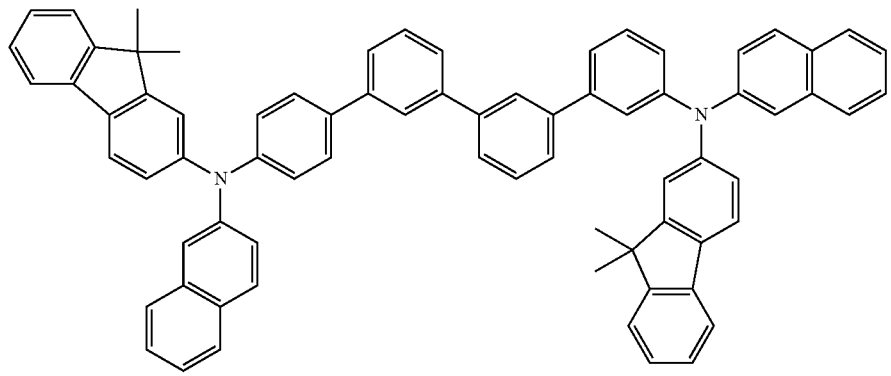

The electron blocking layer 50 may have a thickness of about 50 Å to about 1,000 Å, e.g., about 100 Å to about 300 Å. Maintaining the thickness of the electron blocking layer 50 at about 50 Å or greater may help prevent deterioration of electron blocking properties. Maintaining the thickness of the electron blocking layer 50 at about 1,000 Å or less may help prevent an increase in the driving voltage.

In an implementation, the hole blocking layer 60 may include a second compound represented by Formula 2.

[Formula 2]

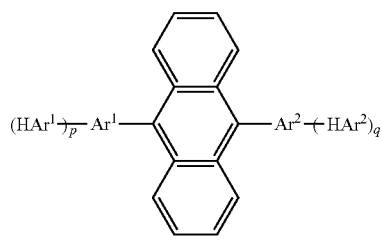

In Formula 2, $Ar^1$ may be, e.g., a substituted or unsubstituted phenylene group, $Ar^2$ may be, e.g., a substituted or unsubstituted phenylene group or a substituted or unsubstituted naphthylene group, and $HAr^1$ and $HAr^2$ may each independently be, e.g., a substituted or unsubstituted pyridine group, a quinoline group, or an isoquinoline group. p and q may each independently be integers of 0 to 3, e.g., may each independently be 0, 1, 2, or 3. In an implementation, when p or q is 2 or greater, each $HAr^1$ or $HAr^2$ may be the same as or different from each other. In an implementation, a sum of p and q may be 1 or greater, e.g., may be an integer of 1 to 6.

The second compound represented by Formula 2 may be represented by one of Formula 2-1 to Formula 2-9.

(2-1)

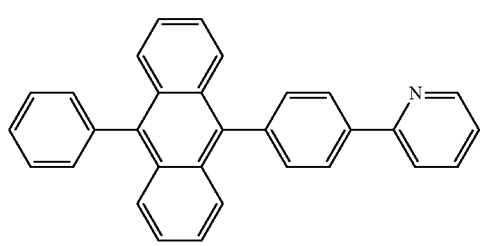

(2-2)

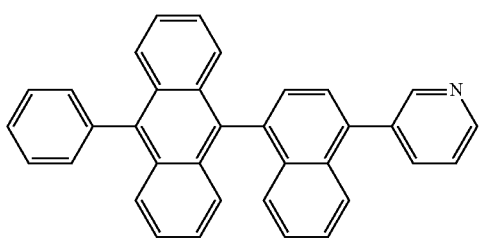

(2-3)

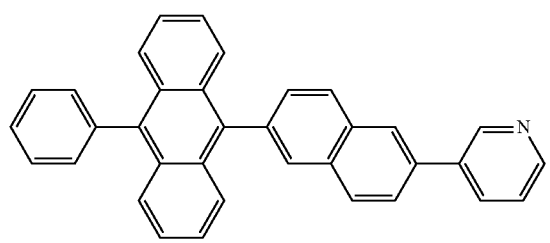

(2-4)

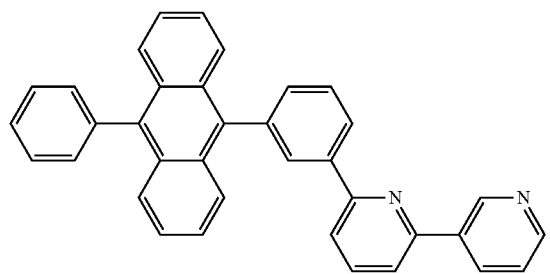

(2-5)

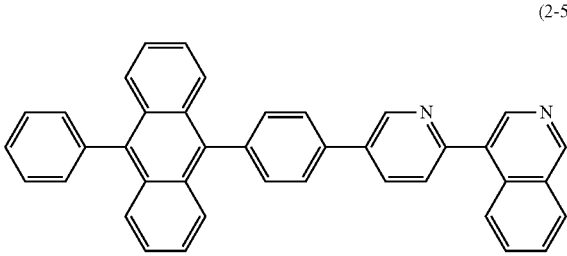

-continued (2-6)
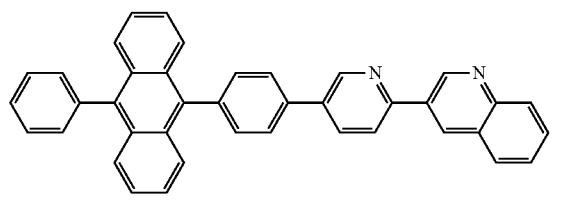

(2-7)
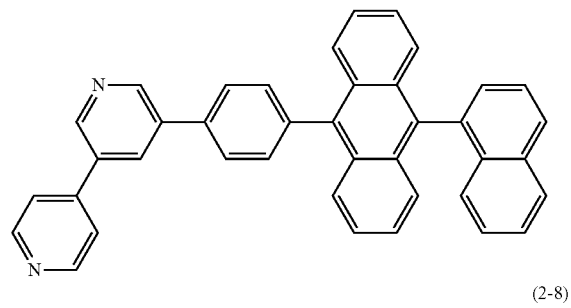

(2-8)
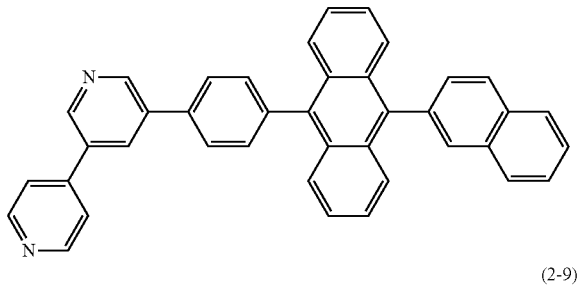

(2-9)
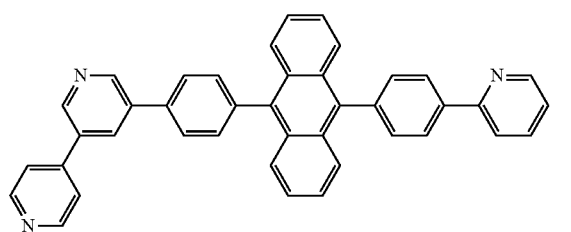

The hole blocking layer may have a thickness of about 10 Å to 1,000 Å. Maintaining the thickness of the hole blocking layer at about 10 Å or greater may help prevent deterioration of hole blocking characteristics. Maintaining the thickness of the hole blocking layer at about 1,000 Å or less may help prevent an increase in the driving voltage.

The organic light emitting diode according to the an embodiment may include the phenyl-based (e.g., phenyl-containing) compound represented by Formula 1 in the electron blocking layer and may simultaneously include the anthracene-based (e.g., anthracene-containing) compound represented by Formula 2 in the hole blocking layer. Thus, efficiency and lifespan of the diode may be improved.

Figure 3:
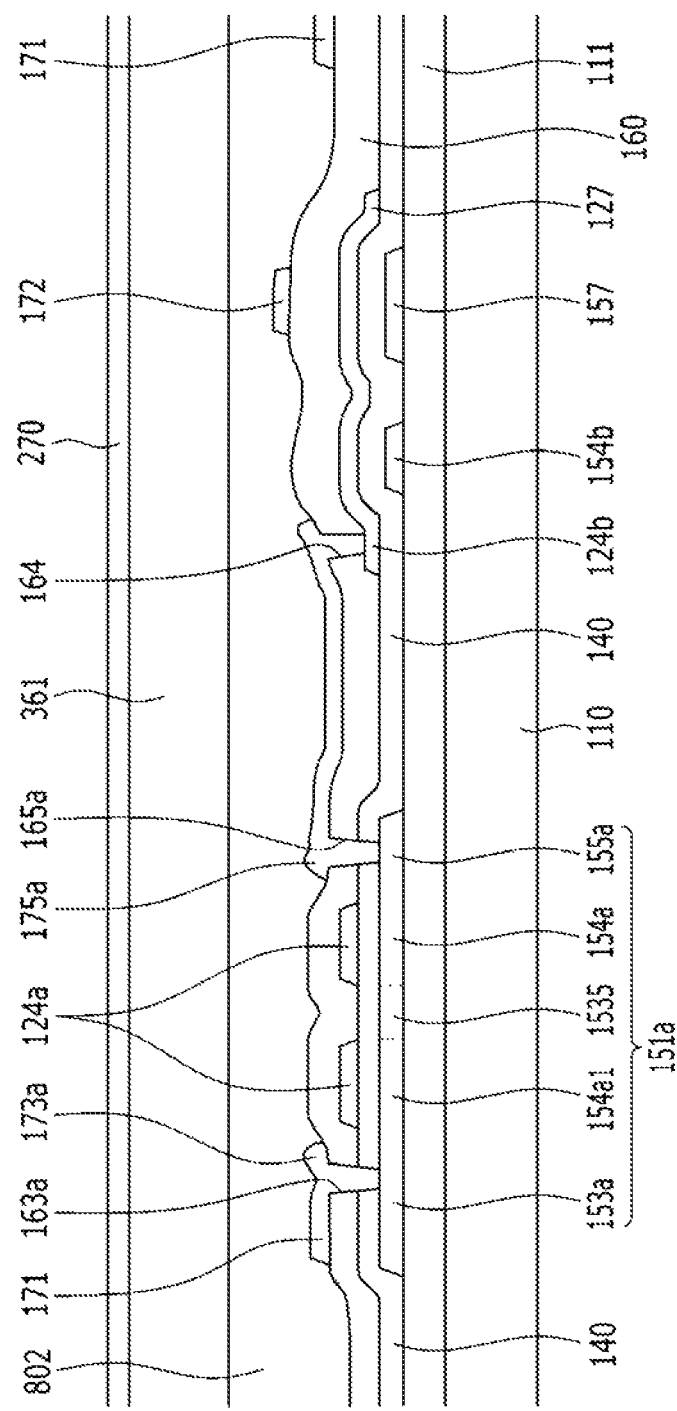
FIG. 3 illustrates a cross-sectional view of the organic light emitting device of FIG. 2 taken along a line III-III.
Figure 4:
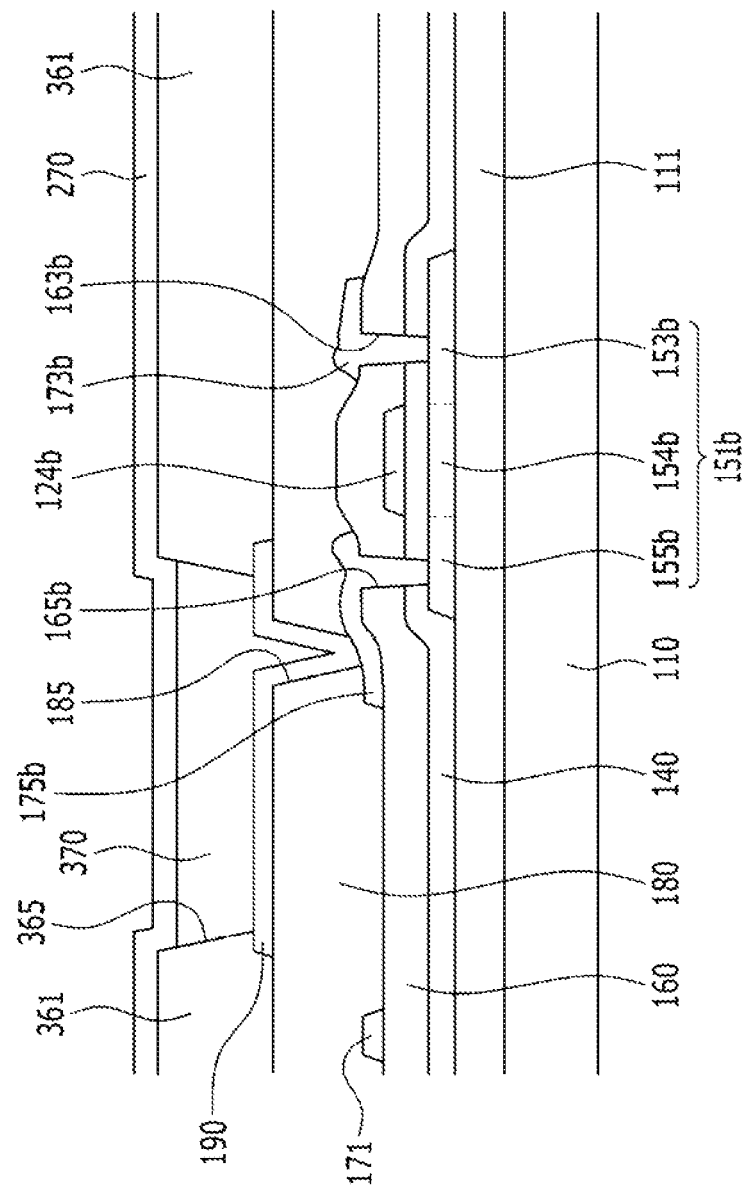
FIG. 4 illustrates a cross-sectional view of the organic light emitting device of FIG. 2 taken along a line IV-IV.

An organic light emitting device including an organic light emitting diode according to an embodiment will now be described with reference to FIG. 2 to FIG. 4.

FIG. 2 illustrates a layout view of an organic light emitting device according to an exemplary embodiment. FIG. 3 illustrates a cross-sectional view of the organic light emitting device of FIG. 2 with respect to a line III-III. FIG. 4 illustrates a cross-sectional view of the organic light emitting device of FIG. 2 with respect to a line IV-IV.

A blocking or buffer layer 111 (made of a silicon oxide or a silicon nitride) may be formed on a substrate 110 (made of transparent glass). The blocking or buffer layer 111 may have a dual-layer structure.

A plurality of pairs of first and second semiconductor islands or layers 151a and 151b (made of polysilicon) may be formed on the blocking or buffer layer 111. The semiconductor islands or layers 151a and 151b may respectively include a plurality of extrinsic regions including an n- or p-type conductive impurity, and at least one intrinsic region substantially not including a conductive impurity.

Regarding the first semiconductor layer 151a, the extrinsic region may include first source and drain regions 153a and 155a and an intermediate region 1535, and they may be doped with an n-type impurity and are separated from each other. The intrinsic region may include a pair of first channel regions (154a1, 154a2) provided between the extrinsic regions 153a, 1535, and 155a.

Regarding the second semiconductor layer 151b, the extrinsic region may include second source and drain regions 153b and 155b, and they may be doped with a p-type impurity and are separated from each other. The intrinsic region may include a second channel region 154b provided between the second source and drain regions 153b and 155b and a storage region 157 extended upwardly from the second source region 153b.

The extrinsic region may further include a lightly doped region (not shown) between the channel regions (154a1, 154a2, and 154b) and the source and drain regions (153a, 155a, 153b, and 155b). The lightly doped region may be replaced with an offset region substantially not including an impurity.

In contrast, the extrinsic regions 153a and 155a of the first semiconductor layer 151a may be doped with a p-type impurity, or the extrinsic regions 153b and 155b of the second semiconductor layer 151b may be doped with an n-type impurity. The p-type conductive impurity may include, e.g., boron (B) and gallium (Ga), and the n-type conductive impurity may include, e.g., phosphorus (P) and arsenic (As).

A gate insulating layer 140 (formed with a silicon oxide or a silicon nitride) may be formed on the semiconductor layers 151a and 151b and the blocking or buffer layer 111.

A plurality of gate lines 121 (including a first control electrode 124a and a plurality of gate conductors including a plurality of second control electrodes 124b) may be formed on the gate insulating layer 140.

The gate line 121 may transmit a gate signal and may extend in a horizontal direction. The first control electrode 124a may be extended upward from the gate line 121, may cross the first semiconductor layer 151a, and may overlap the first channel regions (154a1 and 154a2). Each gate line 121 may include a wide end portion for accessing another layer or an external driving circuit. When a gate driving circuit for generating a gate signal is integrated on the substrate 110, the gate line 121 may be extended to be connected to the gate driving circuit.

The second control electrode 124b may be separated from the gate line 121 and may overlap the second channel region 154b of the second semiconductor layer 151b.

The second control electrode 124b may be extended to configure a storage electrode 127, and the storage electrode 127 may overlap the storage region 157 of the second semiconductor 151b.

The gate conductors 121 and 124b may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), or the like. In an implementation, they may have a multilayer structure including at least two conductive layers with different physical properties. One of the conductive layers may be formed using a metal having low resistivity, such as an aluminum-based metal, a silver-based metal, or a copper-based metal, in order to help reduce signal delay or voltage drop. Another conductive layer may be formed using a material having good physical, chemical, and electrical contact characteristics particularly with indium tin oxide (ITO) and indium zinc oxide (IZO), such as a molybdenum-based metal, chromium, tantalum, titanium, or the like. Examples of the combination may include a lower chromium film and an upper aluminum (alloy) film, and a lower aluminum (alloy) film and an upper molybdenum (alloy) film. In an implementation, the gate conductors 121 and 124b may be made of various metals or conductors.

Sides of the gate conductors 121 and 124b may be slanted with respect to the surface of the substrate 110 by, e.g., an angle of about 30 to 80°.

An interlayer insulating layer 160 may be formed on the gate conductors 121 and 124b. The interlayer insulating layer 160 may be made of an inorganic insulator such as a silicon nitride or silicon oxide, an organic insulator, and a low dielectric insulator. A dielectric constant of the low dielectric insulator may be, e.g., less than 4.0, and a-Si:C:O and a-Si:O:F formed by plasma enhanced chemical vapor deposition (PECVD) may be examples thereof. The interlayer insulating layer 160 may be made of an organic insulator having photosensitivity, and may have a flat surface.

A plurality of contact holes 164 for exposing the second control electrode 124b may be formed on the interlayer insulating layer 160. A plurality of contact holes 163a, 163b, 165a, and 165b for exposing the source and drain regions 153a, 153b, 155a, and 155b may be formed on the interlayer insulating layer 160 and the gate insulating layer 140.

A plurality of data conductors (including a data line 171, a driving voltage line 172, and first and second output electrodes 175a and 175b) may be formed on the interlayer insulating layer 160.

The data line 171 may transmit a data signal, it may be mainly extended in a longitudinal direction, and may cross the gate line 121. Each data line 171 may include a plurality of first input electrodes 173a connected to the first source region 153a through the contact hole 163a, and may include a wide end portion for accessing another layer or an external driving circuit. When a data driving circuit for generating a data signal is integrated on the substrate 110, the data line 171 may be extended to be connected to the data driving circuit.

The driving voltage line 172 may transmit a driving voltage, may be mainly extended in the perpendicular direction, and may cross the gate line 121. Each driving voltage line 172 may include a plurality of second input electrodes 173b connected to the second source region 153b through the contact hole 163b. The driving voltage line 172 may overlap the storage electrode 127 and may be connected to the same.

The first output electrode 175a may be separated from the data line 171 and the driving voltage line 172. The first output electrode 175a may be connected to the first drain region 155a through the contact hole 165a, and may be connected to the second control electrode 124b through the contact hole 164.

The second output electrode 175b may be separated from the data line 171, the driving voltage line 172, and the first output electrode 175a, and may be connected to the second drain region 155b through the contact hole 165b.

The data conductors 171, 172, 175a, and 175b may be made of, e.g., a refractory metal such as molybdenum, chromium, tantalum, titanium, or an alloy thereof, and they may have a multilayer structure including a refractory metal layer (not shown) and a low resistance conductive layer (not shown). Examples of the multilayer structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. In an implementation, the data conductors 171, 172, 175a, and 175b may be made of various kinds of metals and conductors.

In a like manner of the gate conductors 121 and 121b, sides of the data conductors 171, 172, 175a, and 175b may be slanted with respect to the surface of the substrate 110 by an angle of, e.g., about 30 to 80°.

A passivation layer 180 may be formed on the data conductors 171, 172, 175a, and 175b. The passivation layer 180 may be formed with an inorganic material, an organic material, or a low dielectric insulating material.

A plurality of contact holes 185 for exposing the second output electrode 175b may be formed on the passivation layer 180. A plurality of contact holes (not shown) for exposing an end portion of the data line 171 may be formed on the passivation layer 180, and a plurality of contact holes (not shown) for exposing an end portion of the gate line 121 may be formed on the passivation layer 180 and the interlayer insulating layer 160.

A plurality of pixel electrodes 190 may be formed on the passivation layer 180. The pixel electrode 190 may be physically and electrically connected to the second output electrode 175b through the contact hole 185, and it may be made of a transparent conductive material such as ITO or IZO or a reflective metal such as aluminum, silver, or alloys thereof.

A plurality of contact assistants (not shown) or connecting members (not shown) may be formed on the passivation layer 180, and may be connected to the exposed end portions of the gate line 121 and the data line 171.

A partition or pixel defining layer 361 may be formed on the passivation layer 180. The partition 361 may define an opening by wrapping edges of the pixel electrodes 190 like a bank, and may be made of an organic insulator or an inorganic insulator. The partition 361 may be made of a photoresist including black pigments, and it may function as a light blocking member in this case thereby simplifying the manufacturing process.

An organic emission layer 370 may be formed on the pixel electrode 190, and a common electrode 270 may be formed on the organic emission layer 370. As described, the organic light emitting diode including the pixel electrode 190, the organic emission layer 370, and the common electrode 270 may be formed.

A description on the organic light emitting diode corresponds to the previous description. In an implementation, the organic light emitting diode may have a stacked configuration of, e.g., anode/hole transport layer/electron blocking layer/emission layer/hole blocking layer/electron transport layer/cathode or anode/hole injection layer/hole transport layer/electron blocking layer/emission layer/hole blocking layer/electron transport layer/electron injection layer/cathode.

For example, the pixel electrode 190 may be an anode that is a hole injection electrode, and the common electrode 270 may be a cathode that is an electron injection electrode. In an implementation, the pixel electrode 190 may be a cathode and the common electrode 270 may be an anode according to a method for driving an organic light emitting device. Holes and electrons may be injected from the pixel electrode 190 and the common electrode 270 into the organic light emitting layer 370, and when excitons formed as the holes and electrons injected into the organic light emitting layer 370 are combined change from an excited state to a ground state, the organic light emitting layer 370 may emit light.

The common electrode 270 may receive a common voltage and may be made of a reflective metal such as calcium (Ca), barium (Ba), magnesium (Mg), aluminum, silver, or the like, or a transparent conductive material such as ITO or IZO.

Compositions of the electron blocking layer and the hole blocking layer of the organic light emitting diode correspond to the previous description. For example, a first compound (e.g., a phenyl-based compound) may be included in the electron blocking layer of the organic light emitting diode, and simultaneously a second compound (e.g., an anthracene-based compound) may be included in the hole blocking layer.

In the organic light emitting device, the first semiconductor layer 151a, the first control electrode 124a connected to the gate line 121, the first input electrode 173a connected to the data line 171, and the first output electrode 175a may configure a switching thin film transistor (TFT) Qs, and a channel of the switching thin film transistor Qs may be formed in channel regions 154a1 and 154a2 of the first semiconductor layer 151a. The second semiconductor layer 151b, the second control electrode 124b connected to the first output electrode 175a, the second input electrode 173b connected to the driving voltage line 172, and the second output electrode 175b connected to the pixel electrode 190 may configure a driving thin film transistor (TFT) Qd, and a channel of the driving thin film transistor Qd may be formed in the channel region 154b of the second semiconductor layer 151b. The pixel electrode 190, the organic light emitting member 370, and the common electrode 270 may configure an organic light emitting diode, and the pixel electrode 190 may be and anode and the common electrode 270 may be a cathode, or the pixel electrode 190 may be a cathode and the common electrode 270 may be an anode. The overlapping storage electrode 127, the driving voltage line 172, and the storage region 157 may configure a storage capacitor (Cst).

The switching thin film transistor Qs may transmit a data signal of the data line 171 in response to the gate signal of the gate line 121. Upon receiving a data signal, the driving thin film transistor Qd may supply a current that follows a voltage difference between the second control electrode 124b and the second input electrode 173b. A voltage difference between the second control electrode 124b and the second input electrode 173b may be charged in the storage capacitor Cst and may be maintained when the switching thin film transistor Qs is turned off. The organic light emitting diode may display an image by changing intensity according to the current supplied by the driving thin film transistor Qd and emitting light.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

As the anode, a 15 Ω/cm² 500 Å ITO glass substrate (manufactured by Corning) was cut to the size of 50 mm×50 mm×0.5 mm, an ultrasonic wave cleaning process was performed for ten minutes using isopropyl alcohol and pure water, ultraviolet rays were irradiated thereto for ten minutes, they were exposed to ozone to be cleaned, and the glass substrate is was in a vacuum deposition device.

A fourth compound (2-TNATA) represented by Formula 4 was vacuum-deposited as a 600 Å-thick hole injection layer on the glass substrate.

[Formula 4]

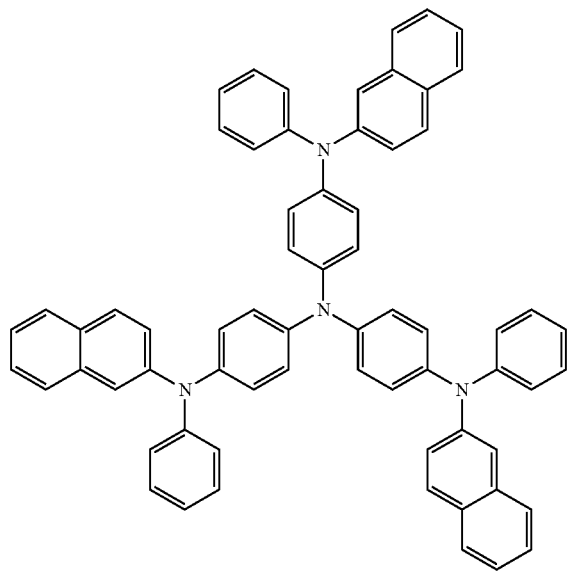

A fifth compound (4,4'-bis[N-(1-naphthyl)-N-phenyl-amino]biphenyl (NPB)) represented by Formula 5 was formed to be a 300 Å thick hole transport layer.

[Formula 5]

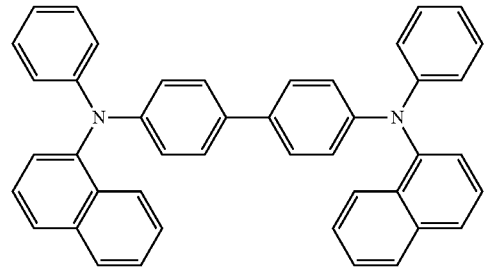

A compound represented by Formula 1-1 was vacuum-deposited to a thickness of 100 Å as an electron blocking layer on an upper portion of the hole transport layer.

[Formula 1-1]

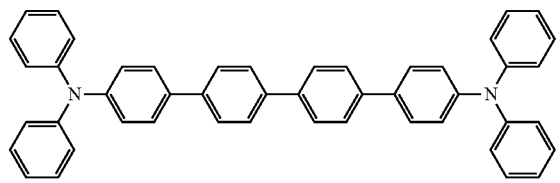

A 300 Å-thick emission layer was formed on an upper portion of the electron blocking layer by doping 5 wt % of a third compound represented by Formula 3 (as a dopant of the emission layer) into a sixth compound (MADN) represented by Formula 6 (as a host of the emission layer).

[Formula 6]

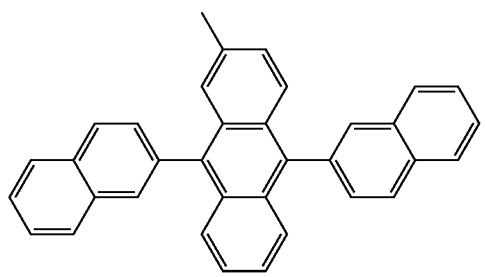

[Formula 3]

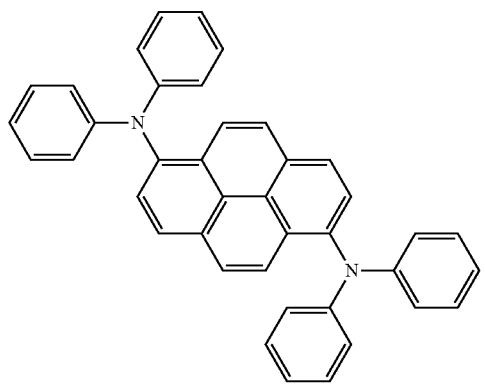

A compound represented by Formula 2-1 was formed to a thickness of 50 Å as the hole blocking layer on an upper portion of the emission layer.

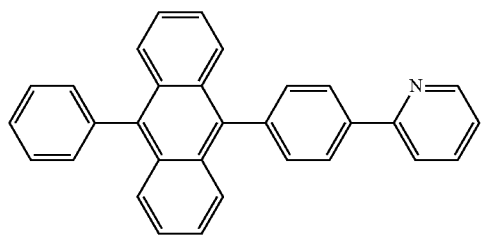 [SMILES: c1ccc(-c2c3ccccc3c(-c3ccc(-c4ccccn4)cc3)c3ccccc23)cc1]

Alq3 was deposited to a thickness of 300 Å as an electron transport layer on the hole blocking layer, and Al was vacuum-deposited to a thickness of 1,200 Å to form an Al electrode (cathode electrode), and accordingly manufacture an organic electroluminescence element.

Element performance (=current efficiency, Cd/A) when driving the manufactured organic light emitting diode was measured with a current density of 10 mA/cm$^2$, and a time (=lifespan) when initial luminance was reduced to be 80% of initial luminance with the current density 50 mA/cm$^2$ was determined.

For Examples 2 to 15 and Comparative Examples 2 to 5, a diode was manufactured under the same conditions as in Example 1, except for using the materials outlined in Table 1, below, in the electron blocking layer or the hole blocking layer, or omitting the electron blocking layer or hole blocking layer, and performance and lifespan thereof were measured.

For Comparative Example 1, a diode was manufactured under the same conditions, except for not including the electron blocking layer and the hole blocking layer, and efficiency and lifespan were evaluated.

Measurement results are shown in Table 1.

TABLE 1

| | Electron blocking layer | Hole blocking layer | Efficiency (cd/A) | Lifespan (h) |
|---|---|---|---|---|
| Example 1 | Formula 1-1 | Formula 2-1 | 5.2 | 130 |
| Example 2 | Formula 1-2 | Formula 2-1 | 5 | 120 |
| Example 3 | Formula 1-3 | Formula 2-1 | 5.1 | 120 |
| Example 4 | Formula 1-8 | Formula 2-1 | 5.6 | 110 |
| Example 5 | Formula 1-9 | Formula 2-1 | 5.5 | 130 |
| Example 6 | Formula 1-13 | Formula 2-1 | 5.4 | 110 |
| Example 7 | Formula 1-14 | Formula 2-1 | 5.5 | 120 |
| Example 8 | Formula 1-15 | Formula 2-1 | 5.6 | 130 |
| Example 9 | Formula 1-2 | Formula 2-2 | 5.4 | 120 |
| Example 10 | Formula 1-8 | Formula 2-2 | 5.3 | 130 |
| Example 11 | Formula 1-13 | Formula 2-2 | 5.1 | 100 |
| Example 12 | Formula 1-15 | Formula 2-2 | 5.2 | 110 |
| Example 13 | Formula 1-14 | Formula 2-5 | 5.3 | 110 |
| Example 14 | Formula 1-15 | Formula 2-8 | 5.4 | 140 |
| Example 15 | Formula 1-14 | Formula 2-9 | 5.5 | 120 |
| Comparative Example 1 | — | — | 3.7 | 55 |
| Comparative Example 2 | Formula 1-1 | — | 4.6 | 47 |
| Comparative Example 3 | — | Formula 2-1 | 4.5 | 35 |
| Comparative Example 4 | Formula 1-15 | — | 4.4 | 50 |
| Comparative Example 5 | — | Formula 2-2 | 4.7 | 60 |

As may be seen in Table 1, when the compound of Formula 1 was included in an electron blocking layer and the compound of Formula 2 was included in a hole blocking layer, efficiency and lifespan were substantially improved, compared to Comparative Example 1 in which the electron blocking layer and the hole blocking layer were not included.

Further, compared to the case of selectively including the electron blocking layer or the hole blocking layer, as in Comparative Examples 2 to 4, the Examples acquired a substantial effect in the viewpoint of efficiency and lifespan.

By way of summation and review, an organic light emitting diode device may require a high driving voltage, may exhibit low light emission luminance or efficiency, and may have a short light emission lifespan.

The organic light emitting diode according to an embodiment may have improved efficiency and lifespan by including the phenyl-based compound represented by Formula 1 as an electron blocking layer and simultaneously including the anthracene-based compound represented by Formula 2 as a hole blocking layer.

The embodiments may provide an organic light emitting diode having high efficiency and a long lifespan.

The organic light emitting diode according to an embodiment may include the phenyl-based compound in the electron blocking layer of the organic light emitting diode and the anthracene-based compound in the hole blocking layer of the organic light emitting diode to help improve efficiency and lifespan of the organic light emitting diode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode, comprising:
a first compound represented by the following Formula 1; and
a second compound represented by the following Formula 2,

[Formula 1]

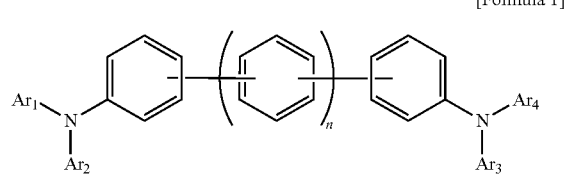

wherein, in Formula 1,
$Ar_1$ to $Ar_4$ are each independently a substituted or unsubstituted aromatic hydrocarbon group, a substituted or unsubstituted aromatic heterocyclic group, or a substituted or unsubstituted condensed polycyclic aromatic group, and
n is an integer of 2 to 4,

[Formula 2]

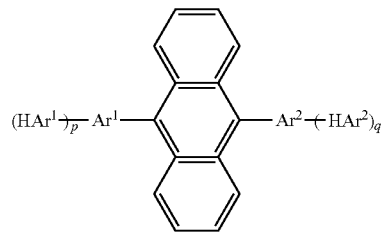

wherein, in Formula 2,
$Ar^1$ is a substituted or unsubstituted phenylene group,
$Ar^2$ is a substituted or unsubstituted phenylene group or a substituted or unsubstituted naphthylene group,
$HAr^1$ and $HAr^2$ are each independently a substituted or unsubstituted pyridine group, a quinoline group, or an isoquinoline group,
p and q are each independently integers of 0 to 3, and
when p or q is 2 or greater, each $HAr^1$ is the same as or different from each other or each $HAr^2$ is the same as or different from each other; wherein at least one of p and q are independently integers of 1 to 3.

2. The organic light emitting diode as claimed in claim 1, wherein:
the organic light emitting diode includes:
an anode,
a cathode facing the anode,
an emission layer between the anode and the cathode,
a hole transport layer between the anode and the emission layer,
an electron blocking layer between the emission layer and the hole transport layer,
an electron transport layer between the cathode and the emission layer, and
a hole blocking layer between the emission layer and the electron transport layer,
the electron blocking layer includes the first compound, and
the hole blocking layer includes the second compound.

3. The organic light emitting diode as claimed in claim 1, wherein the first compound represented by Formula 1 is represented by one of Formula 1-1 to Formula 1-15:

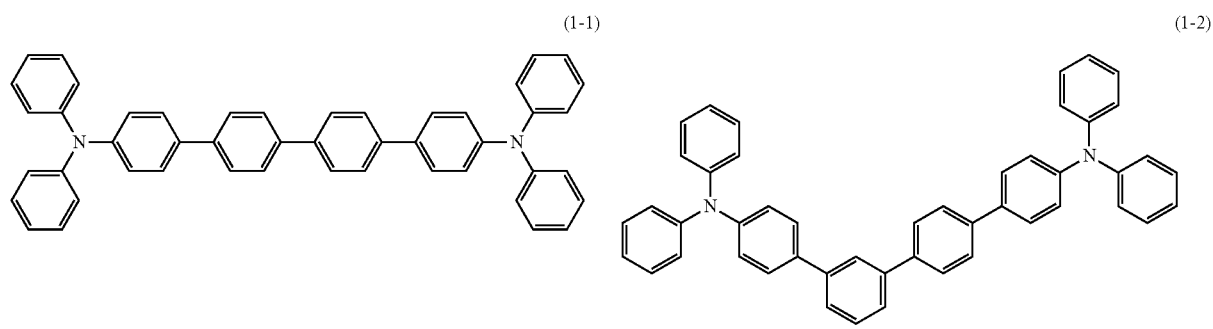

(1-1)

(1-2)

-continued
(1-3) 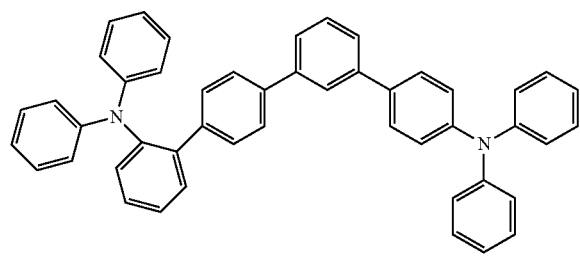
(1-4) 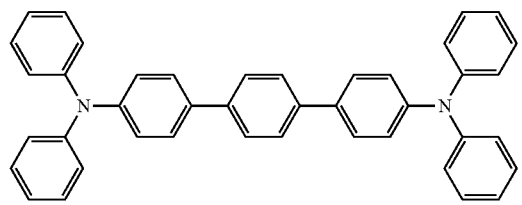
(1-5) 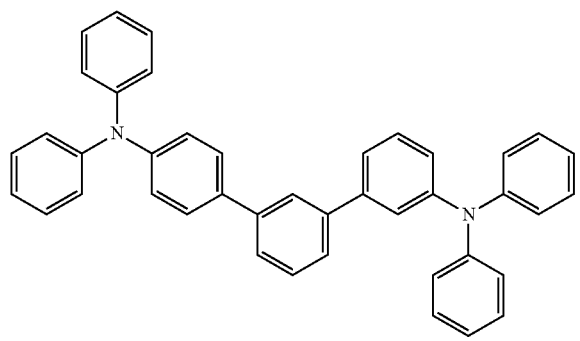
(1-6) 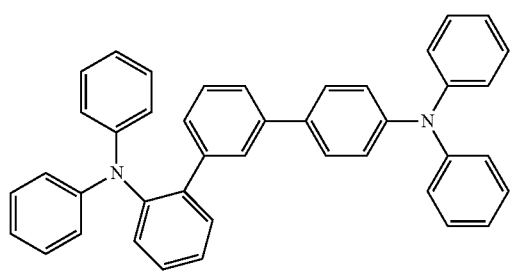
(1-7) 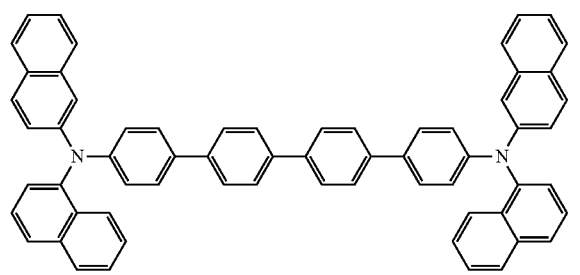
(1-8) 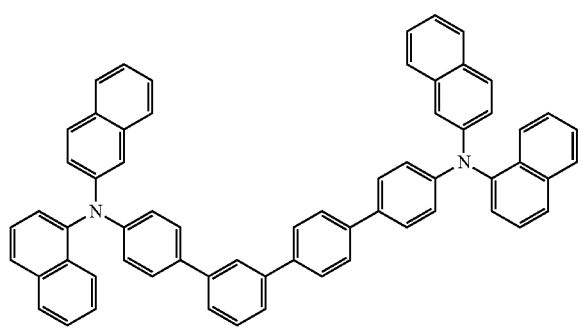
(1-9) 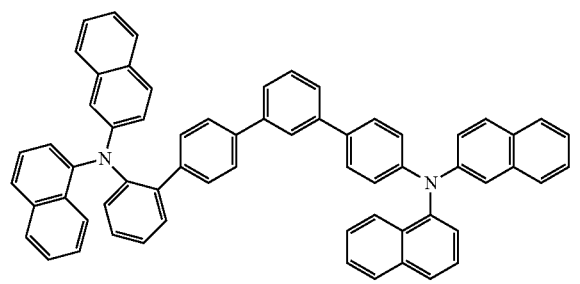
(1-10) 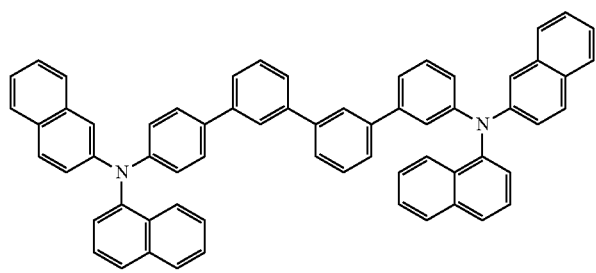
(1-11) 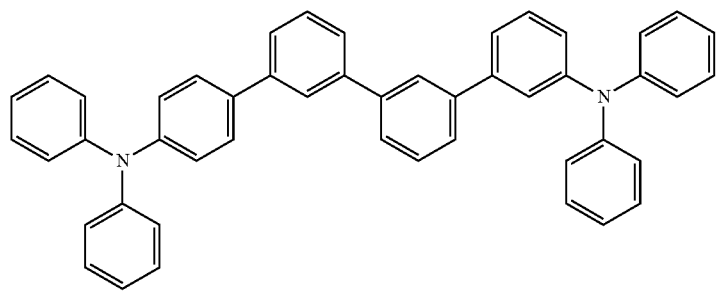

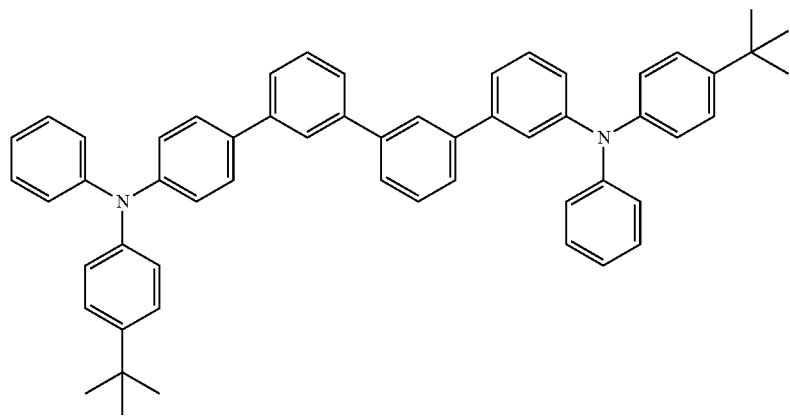
(1-12)
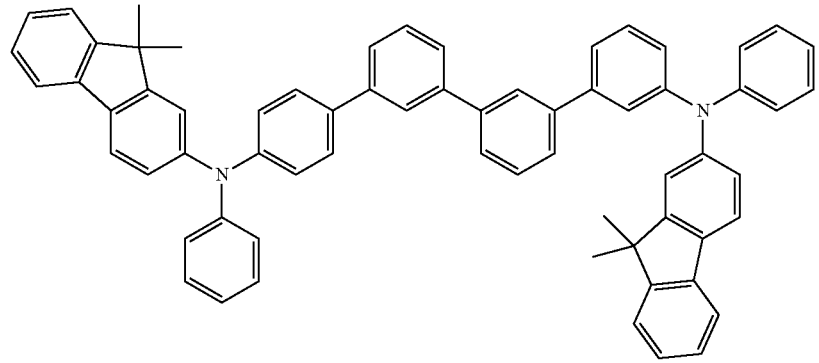
(1-13)
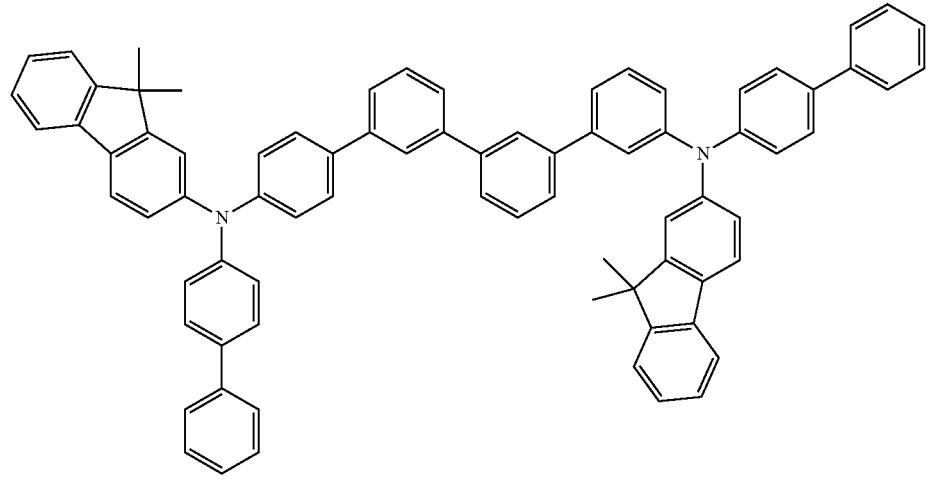
(1-14)
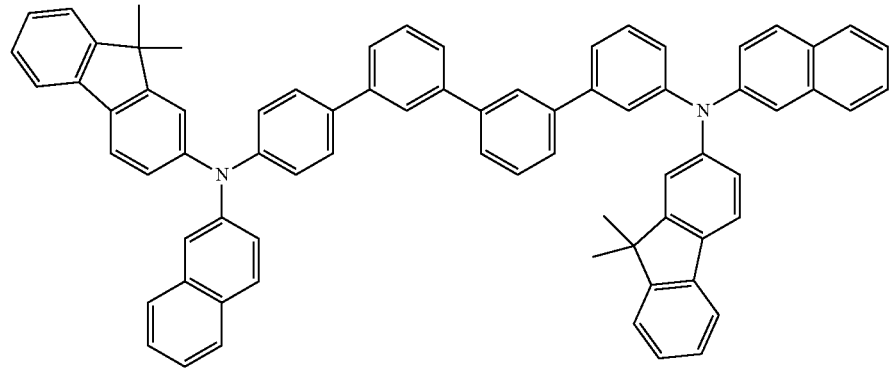
(1-15)

4. The organic light emitting diode as claimed in claim 1, wherein the second compound represented by Formula 2 is represented by one of Formula 2-1 to Formula 2-9:

(2-1)
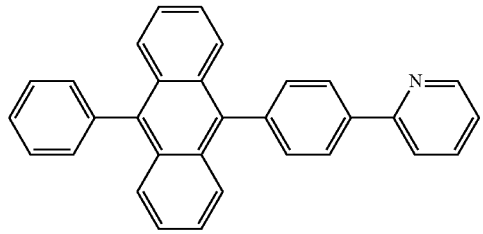

(2-2)
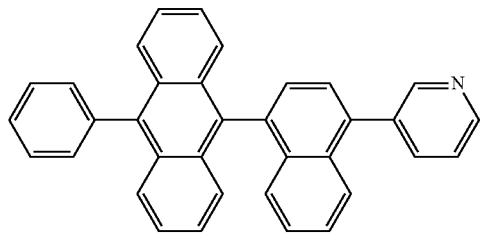

(2-3)
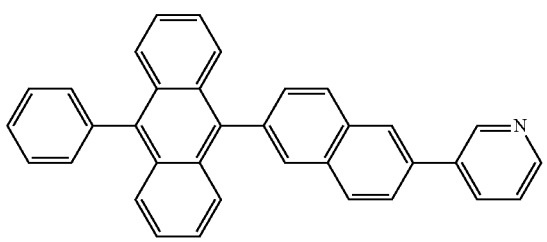

(2-4)
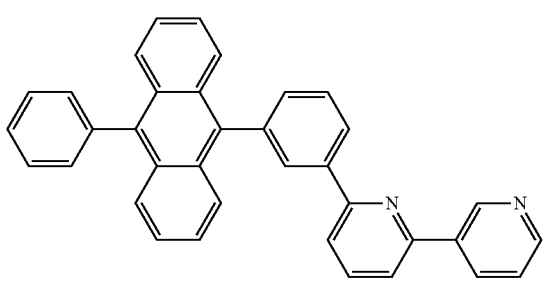

(2-5)
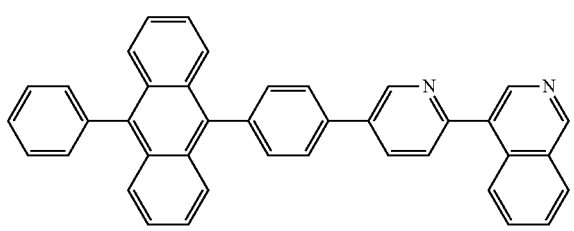

(2-6)
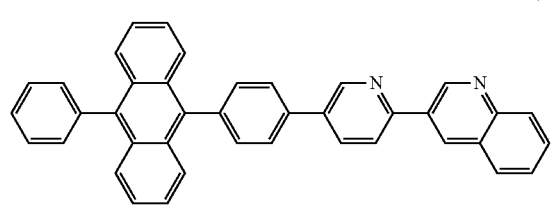

-continued (2-7)
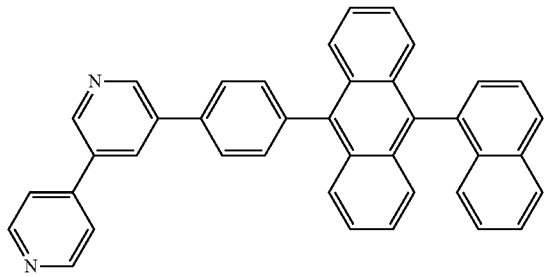

(2-8)
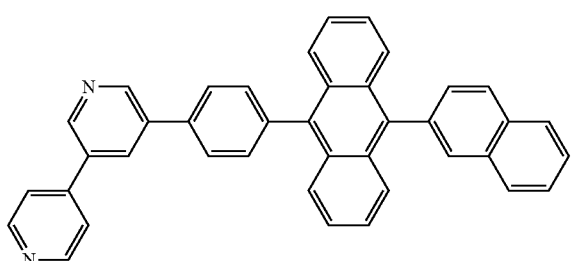

(2-9)
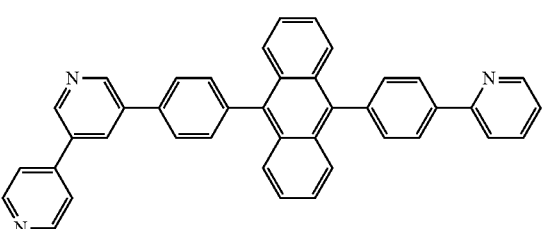

5. The organic light emitting diode as claimed in claim 2, wherein the emission layer includes at least one of tris(8-quinolinolate)aluminum (Alq3), 2-methyl-9,10-di(2-naphthyl) anthracene (MADN), 4,4'-N,N'-dicarbazol-biphenyl (CBP), or poly(n-vinylcarbazole) (PVK).

6. The organic light emitting diode as claimed in claim 5, wherein the emission layer is doped with a third compound represented by the following Formula 3:

[Formula 3]
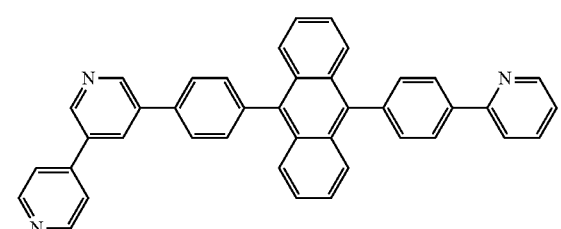

7. The organic light emitting diode as claimed in claim 6, wherein the third compound is included in the emission layer in an amount of about 5 wt % or less, based on a total weight of the emission layer.

8. The organic light emitting diode as claimed in claim 2, wherein the hole transport layer includes at least one of 4,4'',4''''-tris[(3-methylphenyl(phenyl)amino)]triphenylamine (m-MTDATA), 1,3,5-tris[4-(3-methylphenylphenylamino)phenyl]benzene (m-MTDATB), copper phthalocyanine (CuPc), N-phenylcarbazole, polyvinylcarbazole, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or 4,4'-bis[N-(1-naphthyl)-N-phenylamino]biphenyl (NPB).

9. The organic light emitting diode as claimed in claim 2, wherein the electron transport layer includes at least one of Alq3, TAZ, Balq, or Bebq2.

10. An organic light emitting device, comprising:
a substrate;
a gate line on the substrate;
a data line and a driving voltage line crossing the gate line;
a switching thin film transistor connected to the gate line and the data line;
a driving thin film transistor connected to the switching thin film transistor and the driving voltage line; and
an organic light emitting diode connected to the driving thin film transistor,
wherein the organic light emitting diode includes:
a first compound represented by the following Formula 1, and
a second compound represented by the following Formula 2:

[Formula 1]

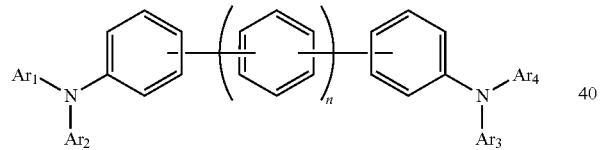

wherein, in Formula 1,
$Ar_1$ to $Ar_4$ are each independently a substituted or unsubstituted aromatic hydrocarbon group, a substituted or unsubstituted aromatic heterocyclic group, or a substituted or unsubstituted condensed polycyclic aromatic group, and n is an integer of 2 to 4,

[Formula 2]

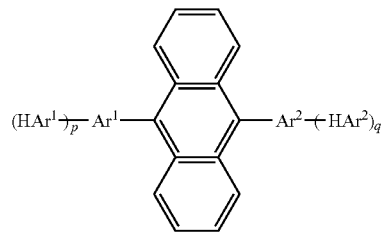

wherein, in Formula 2,
$Ar^1$ is a substituted or unsubstituted phenylene group,
$Ar^2$ is a substituted or unsubstituted phenylene group or a substituted or unsubstituted naphthylene group,
$HAr^1$ and $HAr^2$ are each independently a substituted or unsubstituted pyridine group, a quinoline group, or an isoquinoline group,
p and q are each independently integers of 0 to 3, and
when p or q is 2 or greater, each $HAr^1$ is the same as or different from each other or each $HAr^2$ is the same as or different from each other.

11. The organic light emitting device as claimed in claim 10, wherein:
the organic light emitting diode includes:
an anode,
a cathode facing the anode,
an emission layer between the anode and the cathode,
a hole transport layer between the anode and the emission layer,
an electron blocking layer between the emission layer and the hole transport layer,
an electron transport layer between the cathode and the emission layer, and
a hole blocking layer between the emission layer and the electron transport layer,
the electron blocking layer includes the first compound, and
the hole blocking layer includes the second compound.

12. The organic light emitting device as claimed in claim 10, wherein the first compound represented by Formula 1 is represented by one of Formula 1-1 to Formula 1-15:

(1-1)

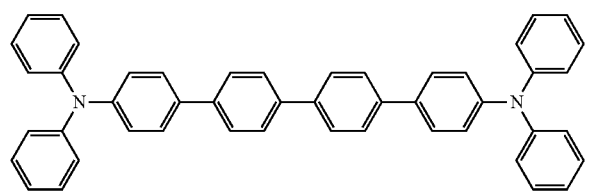

(1-2)

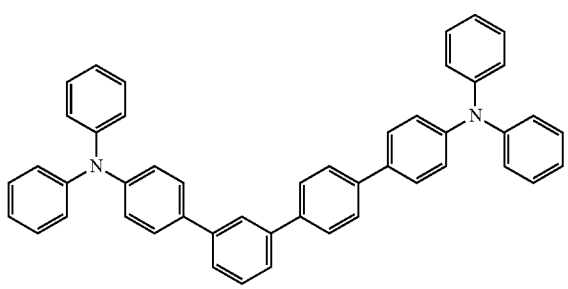

-continued
(1-3)
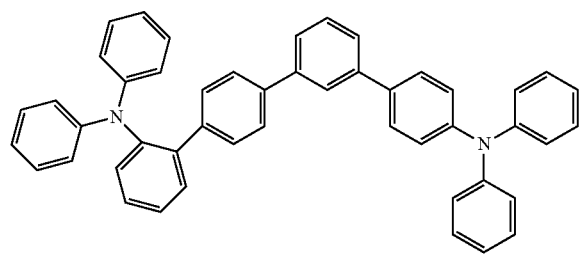
(1-4)
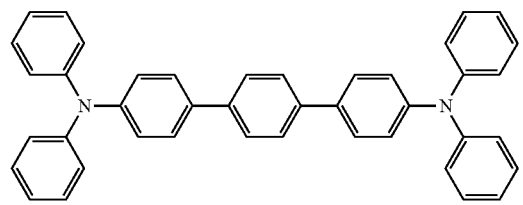
(1-5)
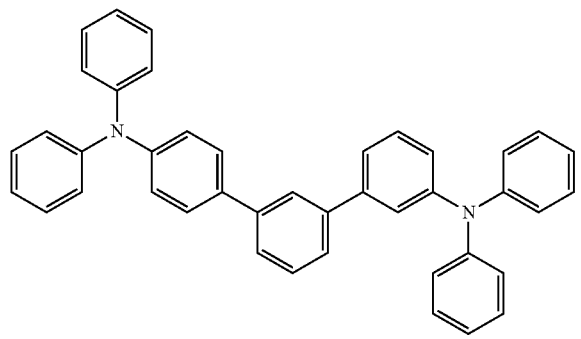
(1-6)
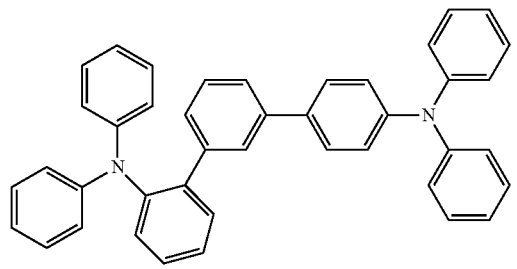
(1-7)
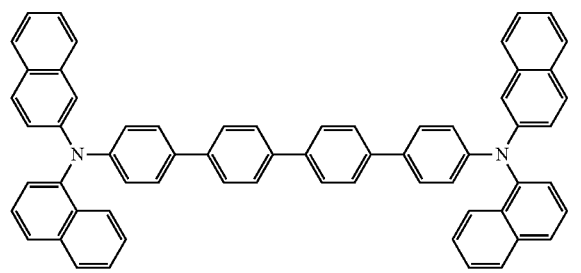
(1-8)
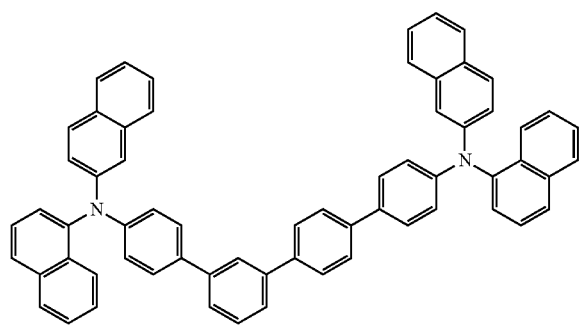
(1-9)
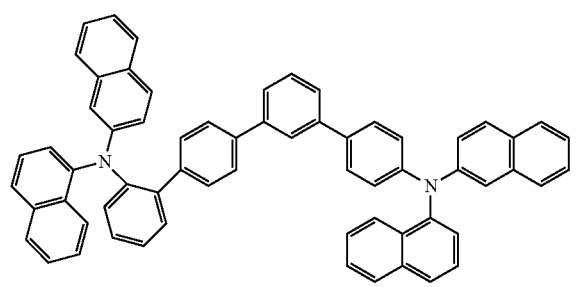
(1-10)
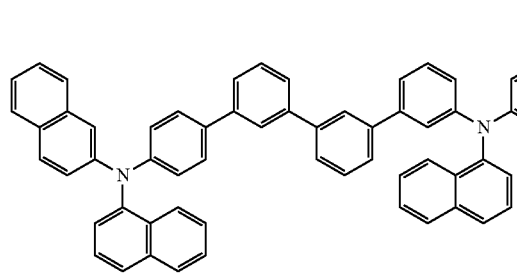
(1-11)
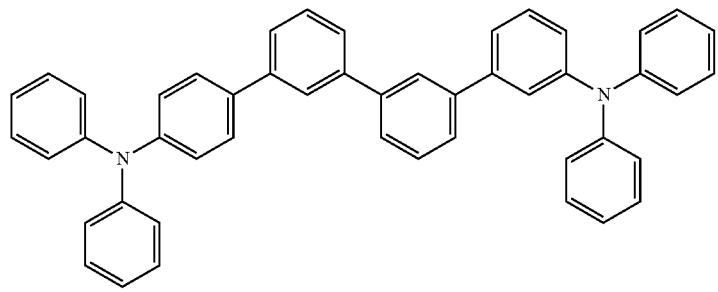

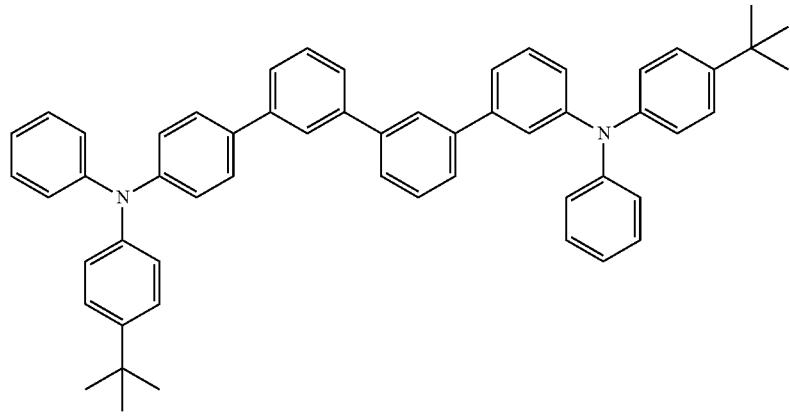
(1-12)
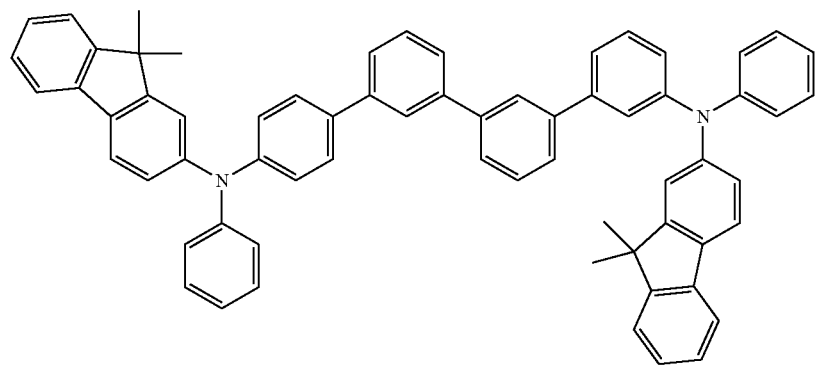
(1-13)
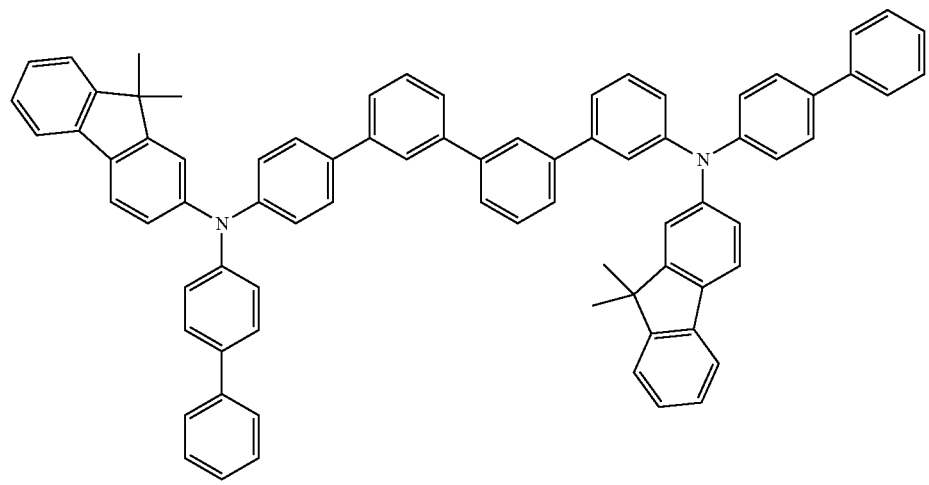
(1-14)

(1-15)
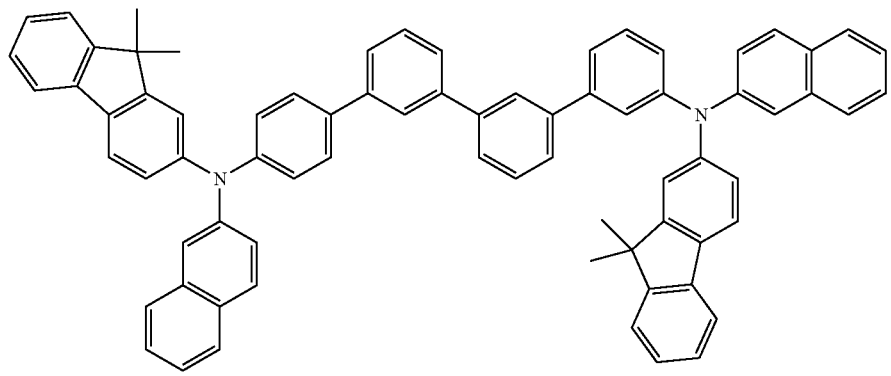
13. The organic light emitting device as claimed in claim 10, wherein the second compound represented by Formula 2 is represented by one of Formula 2-1 to Formula 2-9:
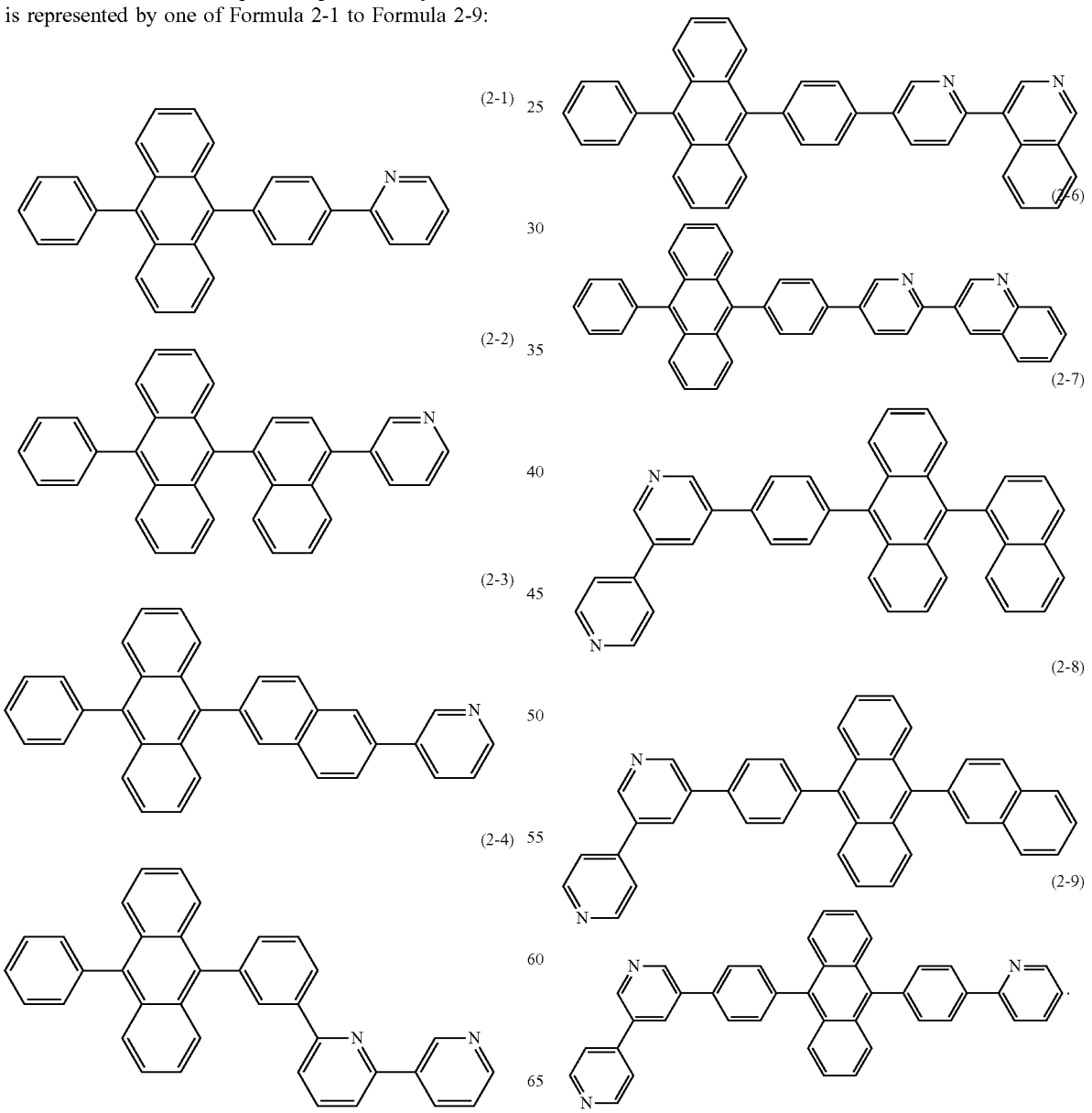

14. The organic light emitting device as claimed in claim 11, wherein the emission layer includes at least one of tris(8-quinolinolate)aluminum (Alq3), 2-methyl-9,10-di(2-naphthyl)anthracene (MADN), 4,4'-N,N'-dicarbazol-biphenyl (CBP), or poly(n-vinylcarbazole) (PVK).

15. The organic light emitting device as claimed in claim 14, wherein the emission layer is doped with a third compound represented by the following Formula 3:

[Formula 3]

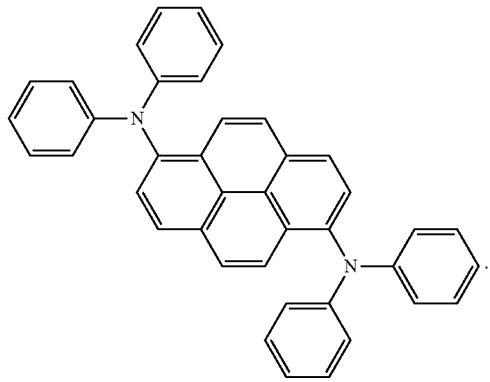

16. The organic light emitting device as claimed in claim 15, wherein the third compound is included in the emission layer in an amount of about 5 wt % or less, based on a total weight of the emission layer.

17. The organic light emitting device as claimed in claim 11, wherein the hole transport layer includes at least one of 4,4'',4''''-tris[(3-methylphenyl(phenyl)amino)]triphenylamine (m-MTDATA), 1,3,5-tris[4-(3-methylphenylphenylamino)phenyl]benzene (m-MTDATB), copper phthalocyanine (CuPc), N-phenylcarbazole, polyvinylcarbazole, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or 4,4'-bis[N-(1-naphthyl)-N-phenylamino]biphenyl (NPB).

18. The organic light emitting device as claimed in claim 11, wherein the electron transport layer includes at least one of Alq3, TAZ, Balq, or Bebq2.

* * * * *